(12) United States Patent  (10) Patent No.: US 7,541,882 B2
Ahmed et al.  (45) Date of Patent: Jun. 2, 2009

(54) ON-CHIP TUNABLE ARTIFICIAL TANK CIRCUIT

(76) Inventors: Abdulhakim Ahmed, 6-35 George Street West, Ottawa, ON (CA) K1S 3J1; James Stuart Wight, 9A-300 Queen Elizabeth Drive, Ottawa, ON (CA) K1S 3M6

( * ) Notice: Subject to any disclaimer, the term of this patent is extended or adjusted under 35 U.S.C. 154(b) by 584 days.

(21) Appl. No.: 11/299,969

(22) Filed: Dec. 13, 2005

(65) Prior Publication Data

US 2007/0126516 A1 Jun. 7, 2007

(30) Foreign Application Priority Data

Dec. 2, 2005 (CA) .................................... 2528674

(51) Int. Cl.
*H03B 27/00* (2006.01)
(52) U.S. Cl. ........................... 331/57; 330/302; 333/213
(58) Field of Classification Search .................... 331/57, 331/175, 167; 330/302; 333/213
See application file for complete search history.

(56) References Cited

U.S. PATENT DOCUMENTS 4,072,910 A * 2/1978 Dingwall et al. .............. 331/57
7,271,676 B2 * 9/2007 Kim ............................ 331/183

* cited by examiner

*Primary Examiner*—Arnold Kinkead
(74) *Attorney, Agent, or Firm*—Marks & Clerk; Richard J. Mitchell

(57) ABSTRACT

Disclosed is a tuned circuit tuned to an input signal having a predetermined radio frequency, the tuned circuit comprising a tank circuit having a loaded ring oscillator circuit with a resonant frequency corresponding to said radio frequency. The tank circuit is configured for a predetermined frequency that the tuned circuit is designed for. In the case wherein the tuned circuit is in CMOS 0.18 μm technology, the tuned circuit is configured for a frequency of up to 7 GHz. The tank circuit may be in the form of an integrated circuit having a size of not more than 200 μm by 200 μm. The tank circuit may form part of a low-noise amplifier or part of a mixer.

18 Claims, 24 Drawing Sheets

$$w = 2\pi 6 \times 10^9$$

$$m = \frac{\omega}{w} + 1$$

$$k = 2\pi 6 \times 10^9$$

$$ro = 1000$$

$$Zamp = \frac{ro}{i\frac{m}{k} + 1}$$

$$theVoutRO = \left(\pi\, DiracDelta[\omega] + \frac{k}{(i\,\omega + k)\,(i\,\omega)}\right)\left(\frac{e^{i\pi m}}{(e^{i\pi m} - 1)}\right)$$

$$theIinRO = \pi\, DiracDelta[w] + \frac{1}{i\,\omega} - \left(\pi\, DiracDelta[w] + \frac{1}{i\,\omega}\right) e^{-i\pi/(w)}$$

$$ZoutRO = -\frac{theVoutRO}{0.1\, theIinRO}$$

$$z = \left(\frac{Zamp\, ZoutRO}{Zamp + ZoutRO}\right)$$

Plot[Abs[z], {ω, w − 0.01 w, w + 0.01 w}]
Plot[20 Log[0.004 Abs[z]], {ω, w − 0.01 w, w + 0.01 w}]

Figure 7

1. the gate voltage of M1 shown in Figure 3.12 is increased.

2. the current through M1 increases.

3. this decreases Vout as the voltage across the load resistors increases, causing a signal (call it signal#1) to be transmitted throughout the inverter(s) of the RO.

4. the gate voltage of M1 is now decreased.

5. the current through M1 decreases.

6. this increases Vout as the voltage across the load resistors decreases. This sends another signal (call it signal#2) to be transmitted throught the inverter(s) of the RO.

7. Now, if the frequency of the input signal is the same as the resonant frequency of the RO, which means that the response of the RO to signal#1 is "in-phase" with the incoming signal, then Vout increases further than normal, as the PMOS transistor of the RO provides lower resistance for the current/charge to flow out of the Vout node into Vdd.

8. When the gate voltage of M1 is increased again, yet another signal propagates through the inverter(s) of the RO.

9. Vout now drops further than normal if the frequency of the input signal is the same as the resonant frequency of the RO, which means that the response of the RO to signal#2 is "in-phase" with the incoming signal, because the NMOS transistor of the RO provides lower resistance for the current/charge to flow out of the Vout node into Vss.

10. The cycle repeats back to step #4.

Figure 13

ON-CHIP TUNABLE ARTIFICIAL TANK CIRCUIT

FIELD OF THE INVENTION

The present invention relates to tuned circuits, such as tuned amplifiers or mixers. More specifically, the present invention relates to an on-chip artificial tank circuit usable in a tuned low-noise amplifier operable at high frequencies without the use of an inductor.

BACKGROUND OF THE INVENTION

Noise in electrical circuits, which is mainly caused by the nature of the semiconductors used, is a hindrance to the incoming signals because it interferes in the demodulation of the signals in the back-end of a radio. It is important to suppress all noise sources at the beginning or the input of the receiver-chain so that the noise does not get amplified by the first circuit.

Since the noise is a natural phenomenon, it is not easy to minimize, except by filtering out the part of the incoming electro-magnetic spectrum that is not occupied by the signal, and by ensuring that maximum power transfer occurs between the antenna and the input of the front-end of a radio. Noise can be further minimized by filtering the output of the amplifier so that those frequencies not within the signal bandwidth are attenuated rather than amplified.

The first circuit to receive the incoming Radio Frequency (RF) signal from the antenna is a tuned amplifier, or a tuned Low Noise Amplifier (LNA). FIG. 1 illustrates an LNA circuit. An LNA is a circuit that amplifies an input signal within a specified Band-Width (BW), while contributing a Noise Figure (NF) small enough so that the Noise Power (Pn) at its output does not affect the rest of the circuit in the RF receiver chain. The LNA is biased in such a way as to minimize its own noise contribution which arises from its components.

Inductors are used to tune the output of the LNA. This kind of an inductor is used in an LC-tank and thus called a "tank-inductor". Here the source of noise in the inductor is less of a concern, as the gain of the LNA causes the output signal to noise ratio to be high as long as the input noise is kept low by minimizing the thermal noise contributed by the resistive elements of the input matching network and the amplifier itself. This minimizes the effective NF, given by equation (1).

$$NF = \frac{SNR_{in}}{SNR_{out}} \quad (1)$$

However, the Q of the active inductors that are used to miniaturize the circuits are also low at higher frequencies, and thus the resulting Q of the LC-tank is low (Qs add in a similar manner as resistors in parallel for $Q_C$ and $Q_L$). For a high gain, which is required to keep the NF in the system low, a high-Q output tank is required to provide a large output impedance to the amplifier.

Accordingly, for operation at higher frequencies, large inductors are required in tuned circuits, and at lower frequencies, large capacitors are required. Further, inductors have low performance at higher frequencies (about 3 GHz) and therefore it becomes economically inefficient to use inductors at those frequencies in integrated circuits (ICs).

The LNA should also have high gain (defined as the ratio of output small-signal Voltage or Power to the input small-signal Voltage or Power) because this renders the noise effect caused by the following circuit components to be negligible.

In addition to providing a low NF, the LNA suppresses the 2nd order harmonic distortions and 3rd order inter-modulation product frequencies not only in order to meet the specifications required for the design of the LNA, but also in order to provide a "clean" output signal to the rest of the components in the receiver chain.

The main purpose of the LC-tank is to store energy obtained from the current and voltage swings produced by the amplifying transistors. This energy cannot be stored perfectly because of the series and parallel resistances in the inductor and capacitor in the tank. Thus there is an effect of loss in the stored energy. However the storage results in a large voltage swing required for amplification. The LC-tank in this case also acts as a resonator in the sense that the inductor produces the voltage from the change in the current swing provided by the amplifying transistor. This voltage change in turn produces the current through the capacitor in the tank, which in turn adds to the initial current through the inductor which would be quite small. The extract current produces a further voltage drop across the inductor, which in turn increases the total amplification of the amplifier without adding resistive noise in the circuit.

The above technique of using the LC-tank is useful for circuits where the size of the chip is not a concern. However, as the RF circuits become faster and require better performances from the on-chip inductors, the inductors get larger in size for better performances because they have a lower series resistance and therefore a higher Q, and thus there is a need to reduce the size of the inductor, or to replace the LC-tank altogether.

It has been previously proposed to replace the inductor in the LC-tank with an artificial or active inductor. There have been several designs made using gyrators, and active inductors. This is usually done to replace the high-Q inductors which are large in size and difficult to implement on ICs. Reducing silicon chip area is one of the most cost-saving goals of IC design. Some of the main uses of inductors are in LC-tank circuits. Designing active inductors which work relatively better at frequencies up to 10 GHz have been proposed. However, even these active inductors break down at frequencies higher than 10 GHz because of the parasitic capacitances intrinsic to active devices like MOSFETs and BJTs, and they work at frequencies below 3 GHz. At lower frequencies, the capacitor in the LC-tank is usually too large to be put on an IC, so that it has to be put off-chip.

SUMMARY OF THE INVENTION

Disclosed is an artificial tank circuit usable in a tuned low-noise amplifier (LNA) operable at high frequencies without the use of an inductor. The artificial tank circuit replaces the inductor-capacitor parallel circuit of the tuned circuit.

Thus, according to one aspect, the invention provides a tuned circuit tuned to an input signal having a predetermined radio frequency, the tuned circuit comprising a tank circuit having a loaded ring oscillator circuit with a resonant frequency corresponding to said radio frequency.

In another aspect, the invention provides a low-noise amplifier (LNA) for receiving input radio frequency signals, the LAN comprising a tuned circuit tuned to an input signal having a predetermined radio frequency, the tuned circuit comprising a tank circuit having a loaded ring oscillator circuit with a resonant frequency corresponding to said radio frequency.

The tuned circuit may further comprise resistive elements configured to linearize the tank circuit. The ring oscillator circuit may include FETs, and said resistive elements may comprise source resistors.

In another embodiment, the tuned circuit further comprises an inverter for providing current to the ring oscillator, wherein the circuit is stable when $R_L < A r_o$, wherein $R_L$ is resistance of the loaded ring oscillator, A is amplification of the inverter and $r_o$ is total output resistance of the inverter.

The tank circuit may be configured for a predetermined frequency that the tuned circuit is designed for. In one embodiment, the tuned circuit is in CMOS 0.18 µm technology, and the tuned circuit is configured for a frequency of up to 7 GHz. The tank circuit may be in the form of an integrated circuit having a size of not more than 200 µm by 200 µm.

In one embodiment, the tank circuit forms part of in a low-noise amplifier. In another embodiment, the tank circuit forms part of a mixer.

There are many advantages in using a tuned circuit having an artificial tank in accordance with the teachings of this invention. First, the circuit in accordance with the teachings of this invention can work up to a maximum frequency for which the given technology (i.e. CMOS 0.18 µm, 0.13 µm, 90 nm) can provide operation voltage gain greater than 20 dB. In the case of CMOS 0.18 µm technology, this frequency is 7 GHz.

Use of an artificial tuned circuit in accordance with the teachings of this invention also minimizes on-chip layout area which in turn reduces manufacturing costs. The resulting tuned circuit is reduces to about one-fiftieth of its original size, about 200 µm by 200 µm. Further, since the circuit is smaller in area, the yield of the manufactured circuits is also improved, since there are now more circuits per square centimeter possible.

While the teachings of this invention focus on an artificial tank used in an LNA, the artificial tank may be used in any tuned circuit, such as a mixer.

Other aspects and advantages of embodiments of the invention will be readily apparent to those ordinarily skilled in the art upon a review of the following description.

BRIEF DESCRIPTION OF THE DRAWINGS

Embodiments of the invention will now be described in conjunction with the accompanying drawings, wherein:

FIG. 7: illustrates equations in Mathematica;

FIG. 13: illustrates a time domain analysis of the artificial tank in accordance with an embodiment of this invention;

Figure 1:
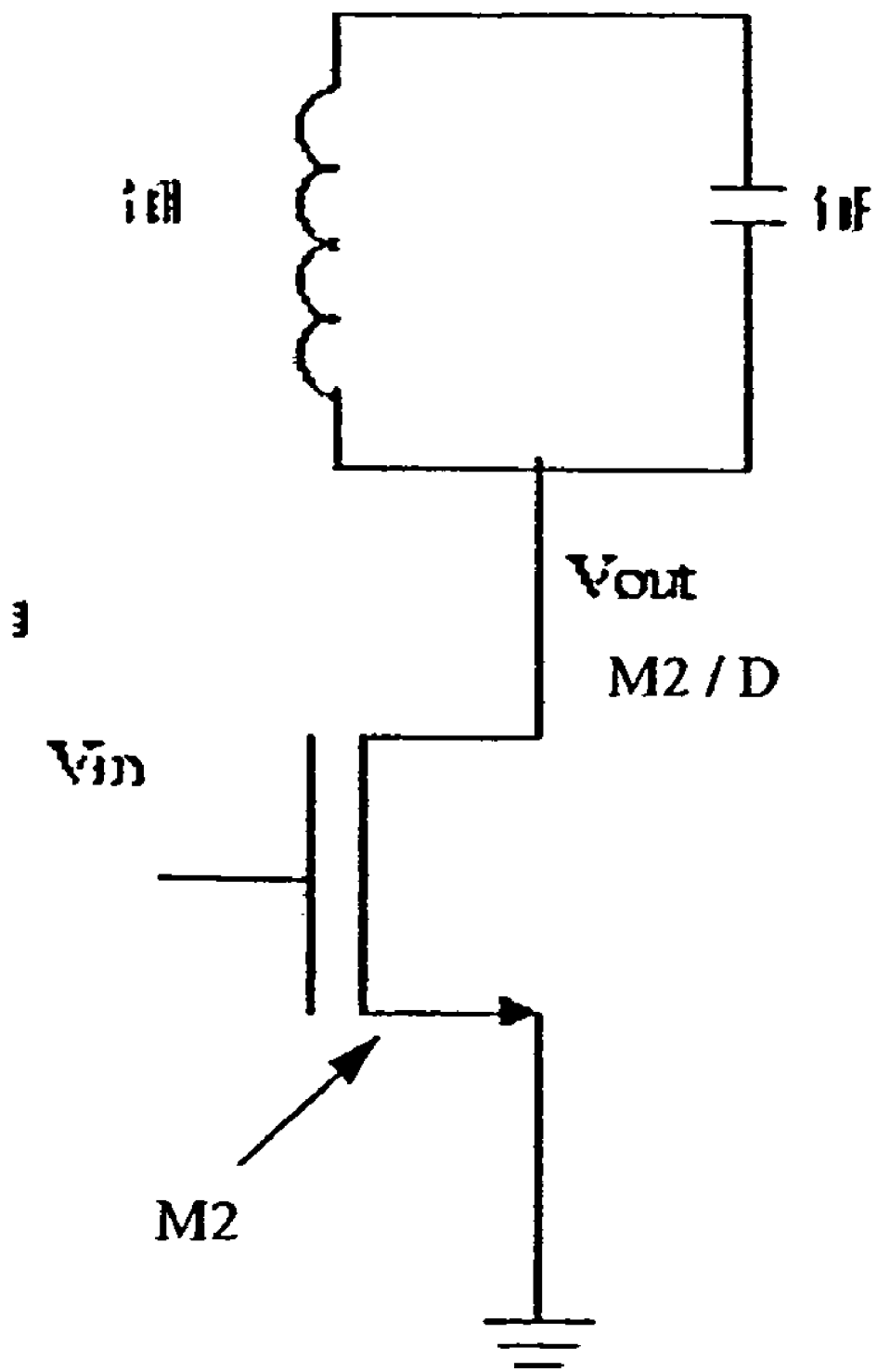
FIG. 1: illustrates a simple amplifier circuit with an LC-tank.

This invention will now be described in detail with respect to certain specific representative embodiments thereof, the materials, apparatus and process steps being understood as examples that are intended to be illustrative only. In particular, the invention is not intended to be limited to the methods, materials, conditions, process parameters, apparatus and the like specifically recited herein.

DETAILED DESCRIPTION OF THE PREFERRED EMBODIMENTS

The perfect ideal LC-tank behaves like an oscillator or a resonator because it oscillates indefinitely once a certain amount of energy is put into it via an initial current or voltage. Real LC-resonators do not store energy indefinitely: they have loss through parallel and series parasitic resistances in the inductor and the capacitor. The equivalent resistance parallel to the LC-tank is the result of two parallel resistances: the intrinsic parallel resistance of the LC-tank and the output resistance of the amplifying transistor. This is what causes the loss in the energy of the tank. In short, an LC-tank used as the load impedance for an amplifying transistor oscillates at a particular frequency when an input signal is present, and does not oscillate when there is no input signal (for stability).

Using a similar concept for the artificial tank, a device that is an oscillator by nature but does not oscillate without an input signal is used, for stability purposes. In electronics such a device is available: a loaded ring oscillator (RO). However, an unloaded ring oscillator oscillates "forever" like a perfect LC-tank, and this is not really desirable if it is to be used as the output impedance of a tuned circuit. So the ring oscillator is damped by introducing a loss in the ring oscillator by connecting a resistor from one of the nodes of the ring oscillator to ground. The value of the resistor is then varied until the ring oscillator is "made stable". There are two main factors to consider. First, the ring oscillator is a non-linear device as it oscillates indefinitely. Second, the tuned amplifier needs a linear impedance in parallel with its transconductance, for example in order to obtain the linearized amplification (e.g. $A=g_m(r_o\|Z_{RO})$). Therefore the ring oscillator is described as a linear device, and as an impedance.

The ring oscillator as an impedance is described below. Starting with the original idea of the LC-tank as a resonator, it is well known that the perfect LC-tank can be represented as an impedance:

$$Z_{out} = \frac{j\omega L}{1-\omega^2 LC} \text{ which reaches infinity as } \omega \to \frac{1}{\sqrt{LC}} \quad (2)$$

The ring oscillator needs to be represented as an impedance that will reach infinity as $\omega$ reaches its resonance frequency. Starting with the simple 1-inverter ring oscillator, the ring oscillator can be seen as an impedance in the following way. A small pulse of test current can be applied into the input/output node (since they are the same). The output voltage obtained immediately after the pulse ends is then measured. The impedance of the ring oscillator is then simply $$Z_{out} = \frac{V_{out}}{I_{in}}.$$

Figure 2:
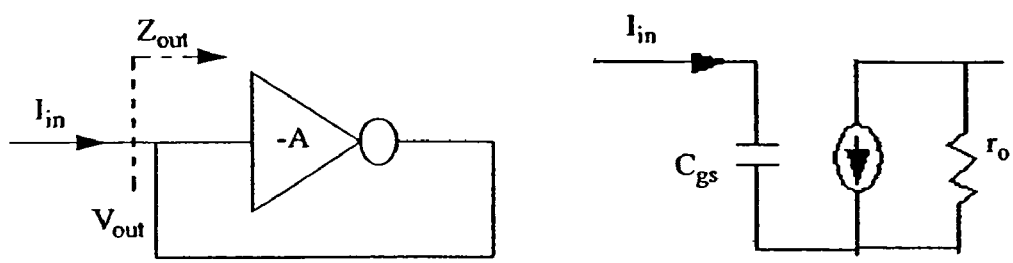
FIG. 2: illustrates a ring oscillator as an impedance and simple small signal MOSFET model.

FIG. 2 shows the idea of how the ring oscillator is represented as an impedance.

Now, when the test current $I_{in}$ is applied, a voltage is formed across the Gate to Source capacitance $C_{gs}$ at the input of the first inverter in the ring oscillator. This voltage is determined by the input impedance of the ring oscillator, which, ignoring other the gate-to-drain and drain-to-source capacitances, is $$Z_{in} = \frac{1}{\frac{1}{r_o} + j\omega C_{gs}} = \frac{r_o}{1+j\omega r_o C_{gs}} \quad (3)$$

Here $r_o$ is the total output resistance of the inverter. The input voltage is now $V_{in}=I_{in}Z_{in}$. The output voltage now generated depends on "A", the amplification of the inverter which is negative. It is assumed, for now, that A is frequency independent, and we will also ignore the fact that $V_{out}$ is delayed by a time $\tau_d$. So now $V_{out}$ can be expressed in terms of $I_{in}Z_{out}$ and A as follows $$V_{out}=V_{in}(-A)=I_{in}Z_{in}(-A) \quad (4)$$

$$Z_{out}(j\omega) = \frac{V_{out}}{I_{in}} = \frac{-Ar_o}{1+j\omega r_o C_{gs}} \quad (5)$$

Figure 3:
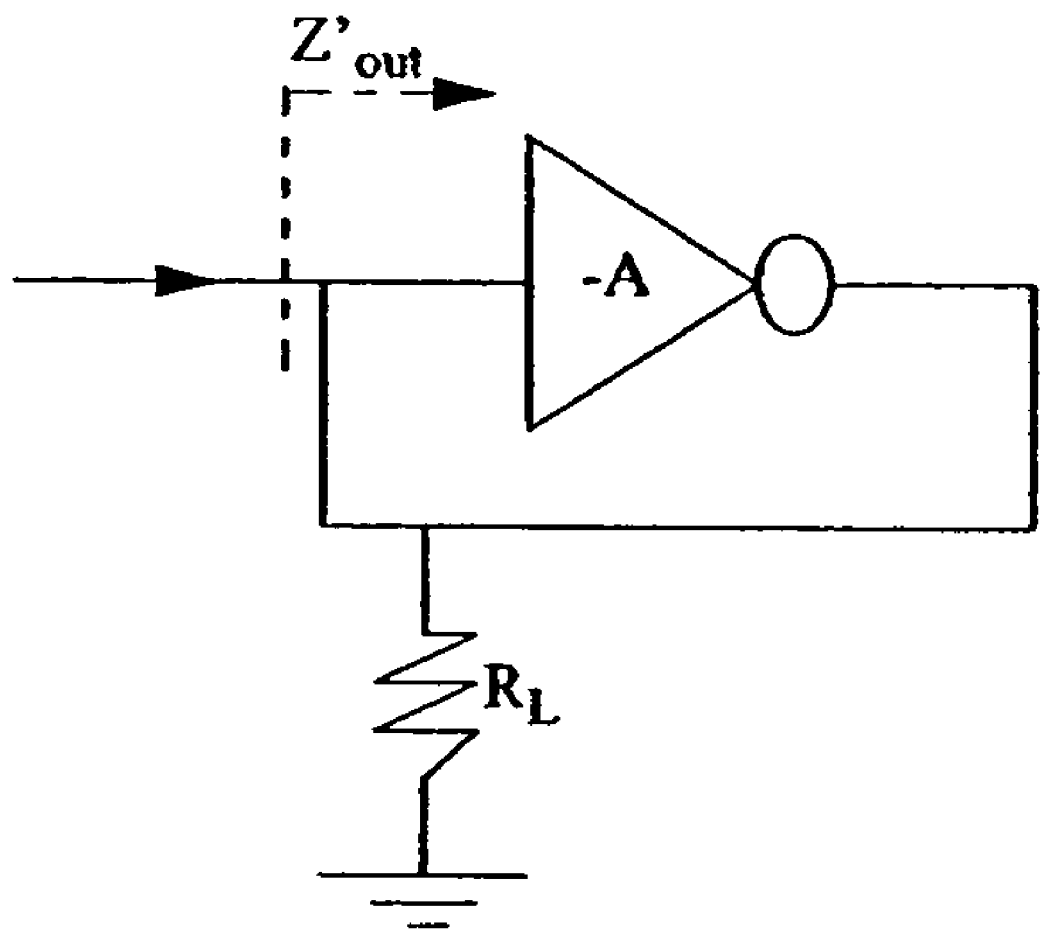
FIG. 3: illustrates a damped ring oscillator as an impedance.

The resistor needed to introduce the loss in order to stabilize the ring oscillator can be connected as shown in FIG. 3. The new output impedance becomes $Z'_{out}=Z_{out}\|R_L$. Calculating this gives:

$$Z'_{out}(j\omega) = \frac{1}{\frac{1}{1+j\omega r_o C_{gs}} + \frac{1}{R_L}} \quad (6)$$

$$= \frac{\frac{A}{C_{gs}}}{\frac{Ar_o - R_L}{r_o R_L C_{gs}} + j\omega} \quad (7)$$

This is in the frequency or $\omega$ domain. In the time domain, this equation becomes $$Z'_{out}(t) = u(t)\frac{A}{C_{gs}}\left[e^{-t\left(\frac{AR_o-R_L}{r_o R_L C_{gs}}\right)}\right] \quad (8)$$

Equation (7) clearly shows that if $R_L$ is greater than $Ar_o$, then the exponential part of the new impedance becomes infinite, and thus the RO$\|R_L$ circuit is unstable. However, if $R_L$ is less than $Ar_o$, then $A'_{out}(t)$ decreases to zero with time, showing that the RO$\|R_L$ circuit is stable. How quickly the circuit stabilizes depends on how large the value of $r_o R_L C_{gs}$ is.

Figure 4:
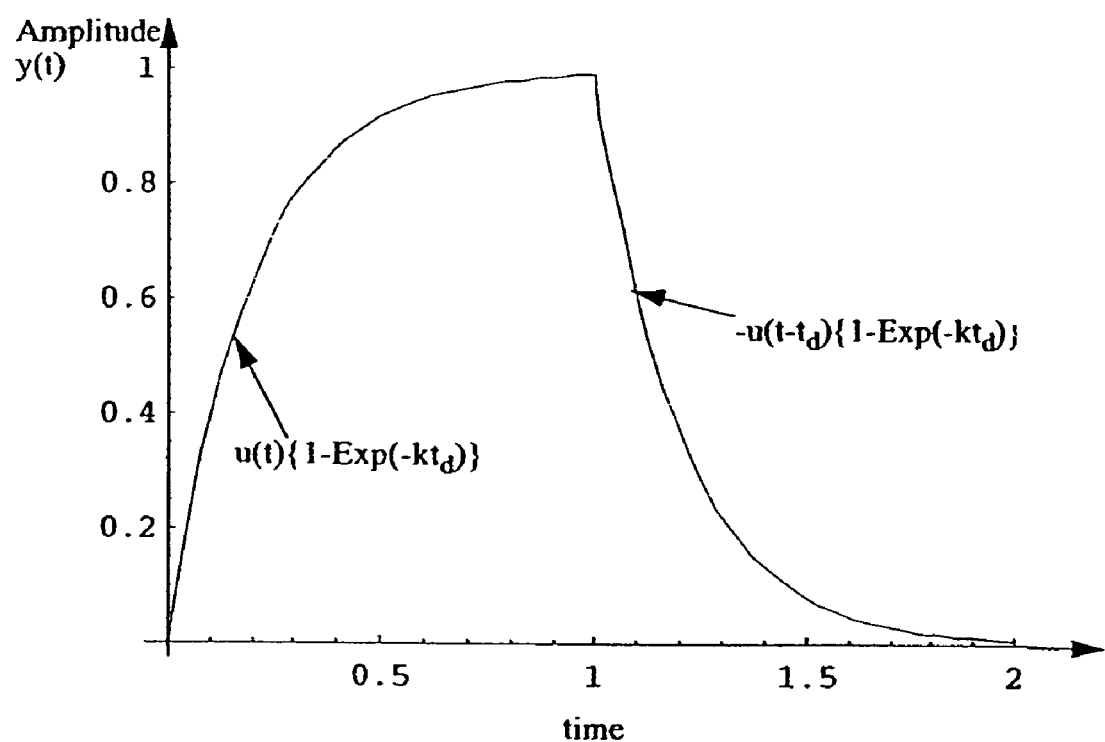
FIG. 4: illustrates a one period of the resulting waveform from equation 12.

Linearization of the ring oscillator is now described. By nature, the ring oscillator is non-linear and continuously oscillates at its resonance frequency which is given by $$\omega_o = \frac{2\pi}{2\tau_d} = \frac{\pi}{\tau_d}$$

where $\tau_d$ (in seconds) is the time delay between the input and output of the inverter(s) in the ring oscillator. The waveform can be approximated as unit-steps multiplied by a decaying exponential as shown in the equations (9 to 13) used in Mathematica below. Here, "m" is the total time of the simulation, and "y" is the output voltage of the ring oscillator. FIG. 4 shows one period of the waveform obtained from these equations.

$$m=2 \quad (9)$$

$$\tau_d=1 \quad (10)$$

$$k=5 \quad (11)$$

$$y = \sum_{n=0}^{m} (-1)^n UnitStep[t-n\tau_d](1-\text{Exp}[-k(t-n\tau_d)]) \quad (12)$$

Plot[y,{t,0,m}]. (13)

Here $$k = \frac{1}{RC},$$

and RC is the time constant formed by the output resistance of the ring oscillator and the RC total capacitance formed by $C_{gs}\|C_{ds}$. Also, u(t) is the unit-step function.

The continuous waveform seen in FIG. 4 can be represented in the frequency or ω domain by representing the continuous wave as a Fourier series as shown in equation (14) below:

$$V_{out} = c_o + c_n \sum_{-\infty}^{\infty} e^{jn\omega_o t} \quad (14)$$

Here, $c_n = c_{n1} + c_{n2}$ and $c_o = c_{o1} + c_{o2}$.
Calculating the first constant:

$$c_{n1} = \frac{1}{2\tau_d} \int_0^{\tau_d} (1 - e^{-kt}) e^{-jn\omega_o t} dt \quad (15)$$

$$= \frac{1}{2\tau_d} \left( \int_0^{\tau_d} e^{-jn\omega_o t} dt - \int_0^{\tau_d} e^{-t(k+jn\omega_o)} dt \right) \quad (16)$$

Integrating, we get:

$$c_{n1} = \frac{1}{2\tau_d} \left( \frac{e^{-jn\omega_o t}}{-jn\omega_o} \bigg|_o^{\tau_d} - \frac{e^{-t(k+jn\omega_o)}}{k+jn\omega_o} \bigg|_o^{\tau_d} \right) \quad (17)$$

Substituting the limits, we get:

$$c_{n1} = \frac{1}{2\tau_d} \left( \frac{e^{-jn\omega_o \tau_d}}{-jn\omega_o} - \frac{1}{-jn\omega_o} - \frac{e^{\tau_d(k+jn\omega_o)}}{k+jn\omega_o} - \frac{1}{k+jn\omega_o} \right) \quad (18)$$

$$= \frac{1}{2\tau_d} \left( \frac{1 - e^{-jn\omega_o \tau_d}}{jn\omega_o} + \frac{1 - e^{-\tau_d(k+jn\omega_o)}}{k+jn\omega_o} \right) \quad (19)$$

Calculating the second constant:

$$c_{n2} = \frac{1}{2\tau_d} \int_{\tau_d}^{2\tau_d} (e^{-k(t-\tau_d)}) e^{-jn\omega_o t} dt \quad (20)$$

$$= \frac{e^{k\tau_d}}{2\tau_d} \int_{\tau_d}^{2\tau_d} e^{-t(jn\omega_o + k)} dt \quad (21)$$

Integrating we get:

$$c_{n2} = \frac{e^{k\tau_d}}{2\tau_d} \left[ \frac{e^{-t(jn\omega_o + k)}}{-(jn\omega_o + k)} \right]_{\tau_d}^{2\tau_d} \quad (22)$$

$$= \frac{1}{2\tau_d} \left[ \frac{e^{-2\tau_i} - e^{-jn\omega_o \tau_d}}{-(jn\omega_o + k)} \right] \quad (23)$$

Now the D.C. components are:

$$c_{o1} = \frac{1}{2\tau_d} \int_0^{\tau_d} [1 - e^{-kt}] dt \quad (24)$$

$$= \frac{1}{2\tau_d} \left[ t + \frac{e^{-kt}}{k} \right]_0^{\tau_d} \quad (25)$$

$$= \left( \frac{1}{2} + \frac{e^{-k\tau_d}}{2k\tau_d} \right) \quad (26)$$

$$c_{o2} = \frac{1}{2\tau_d} \int_{\tau_d}^{2\tau_d} e^{-k(t-\tau_d)} dt \quad (27)$$

$$= \frac{e^{k\tau_d}}{2\tau_d} \left[ -\frac{e^{-kt}}{k} \right]_{\tau_d}^{2\tau_d} \quad (28)$$

$$\frac{1 - e^{-k\tau_d}}{2k\tau_d} \quad (29)$$

$$\therefore c_o = c_{o1} + c_{o2} \quad (30)$$

$$= \left( \frac{1}{2} + \frac{1}{2k\tau_d} \right) \quad (31)$$

At $t = 2\tau_d$, $V = c_o + c_n$, which is entirely in the $n\omega_o$ domain i.e. the frequency domain, and this series can be plotted using the following Matlab program:

k=5; td=1; w=pi/td;
%co=0.5+(0.5)*(1/k*td);
n=[0:100];

cn1=((1-exp(-i*pi.*n))/(i*w.*n)+(1-exp(-td*(k+(i*pi.*n))))./(k+i*w*n))/(2*td);

cn2=((-exp(-td*(k+(2*i*pi.*n)))+exp(-i*pi.*n))./(k+i*w*n))/(2*td);

y=abs(co+cn1+cn2);

stem(n,y); grid % gives magnitude of Cn=Cn1+Cn2 r=real(cn1+cn2);

x=image(cn1+cn2);

d=360*(1/(2*pi))*atan(x./r);

stem(n,d);grid % gives phase of Cn=Cn1+Cn2.

Figure 5:
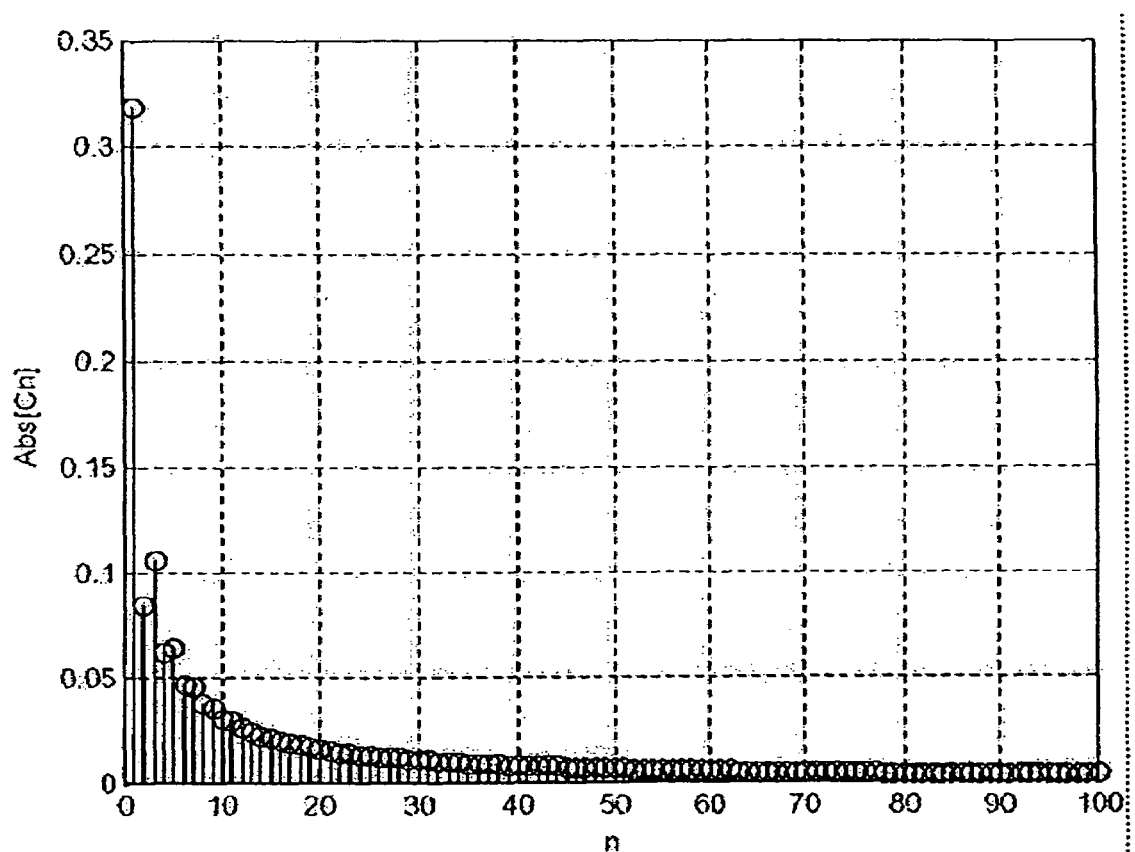
FIG. 5: illustrates a plot for the magnitude of the frequencies from equation 14.
Figure 6:
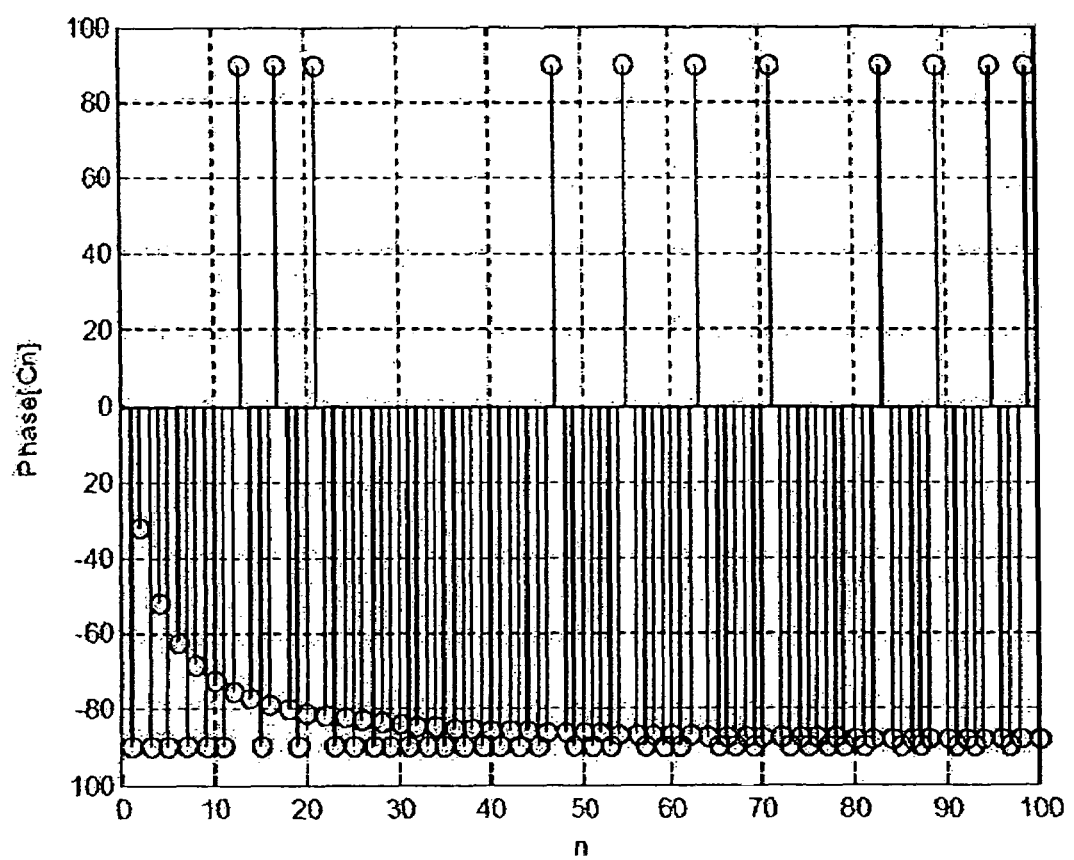
FIG. 6: illustrates the plot generated by the program shows the Phase of the Fourier Series from equation 14.

Ignoring the D.C. component $c_o$, the program above generates the plot in frequency component magnitude shown in FIG. 5 and the phase component shown in FIG. 6.

The plot in FIG. 5 shows the discrete nature of the spectrum generated by the Fourier Series, with the first harmonic=$\omega_o$ at n=1, which has the highest amplitude. Thus $\omega_o$ is the natural resonant frequency of the ring oscillator.

The plot in FIG. 6 shows how all the n=even harmonic frequencies have different phases because they need to cancel each other as "n" increases. On the other hand, the n=odd are all in phase so the amplitudes add up to give the characteristic output waveform of a Ring Oscillator.

The plots in FIGS. 5 and 6 show the discrete nature of the spectrum. The discrete spectrum in frequency implies it is piece-wise continuous in time, and therefore non-linear. This non-linear nature arises from the fact that this waveform is piece-wise continuous and does not begin or end at any point in time. As a result, the Fourier series representation having a discrete spectrum of Vout is not sufficient to describe the behavior of the ring oscillator as an impedance, or to obtain the linear representation of the ring oscillator's output waveform in the frequency domain that would show its function as an artification tank.

However, it is known that the ring oscillator does not being to oscillate unless there is a small disturbance or variation in the output or input current of the inverter(s). This means that there is a specific moment in time that the ring oscillator begins to oscillate when there is a small variation in the current or voltage at its input or output node (which may be the same if an ring oscillator with only one inverter is used).

This fact can now be used to obtain a continuous frequency response of the ring oscillator.

The method used to linearize the ring oscillator output waveform is done in the following way: instead of characterizing the output waveform as a Fourier series of a single period of the waveform, the waveform is characterized as an infinite sum of time-delayed unit-step functions multiplied by the waveform shape, with each time delay equal to $\tau_d$, and the Fourier transform of the resulting function is taken to give a continuous linear spectrum. This characterization implies that the waveform begins or starts at a specific point in time: t=0. Before this, the output is assumed to be =0. This assumption is more realistic than the assumption of a continuous waveform that $v$out begins at negative infinity and continues to positive infinity.

Equation (32) best represents the waveform characterization (here u(t)=unit-step function):

$$V_{out} = u(t)[1 - e^{-kt}] - u(t - \tau_d)[1 - e^{-k(t-\tau_d)}] + \quad (32)$$

$$u(t - 2\tau_d)[1 - e^{-k(t-2\tau_d)}]$$

$$= \sum_{n=0}^{\infty} (-1)^n u(t - n\tau_d)[1 - e^{-k(t-n\tau_d)}] \quad (33)$$

$$= \left( \sum_{n=0}^{\infty} (-1)^n u(t - n\tau_d) - \sum_{n=0}^{\infty} (-1)^n u(t - n\tau_d)(-e^{-k(t-n\tau_d)}) \right) \quad (34)$$

Now the Fourier Transform of the above sum gives the following equation:

$$V_{out}(j\omega) = \sum_{n=0}^{\infty} (-1)^n \left[ \pi\delta(\omega) + \frac{1}{j\omega} \right] e^{-j\omega n} - \sum_{n=0}^{\infty} (-1)^n \left[ \frac{e^{-j\omega n}}{j\omega + k} \right] \quad (35)$$

It can be seen, by intuition, that the representation above does not give the highest amplitude at the resonant frequency of $\omega_o$. However, there is a "hidden" variable in the above equation that can be used to provide the necessary "frequency shift" required to give the highest amplitude at the resonant frequency. This is $(-1)^n$ which can be represented as $e^{-jn\pi}$ as can be seen in the equations below:

$$V_{out}(j\omega) = \sum_{n=0}^{\infty} \left[ \pi\delta(\omega) + \frac{1}{j\omega} \right] e^{-j\omega n \tau_d - jn\pi} - \sum_{n=0}^{\infty} \left[ \frac{e^{-j\omega n \tau_d - jn\pi}}{j\omega + k} \right] \quad (35)$$

But:

$$\omega_o = \frac{2\pi}{2\tau_d} = \frac{\pi}{\tau_d} \quad (37)$$

$$\tau_d = \frac{\pi}{\omega_o}. \quad (38)$$

Hence:

$$V_{out}(j\omega) = \sum_{n=0}^{\infty} \left[ \pi\delta(\omega) + \frac{1}{j\omega} \right] e^{\frac{j\omega n \pi}{\omega_o}} jn\pi - \sum_{n=0}^{\infty} \left[ \frac{e^{\frac{-j\omega n}{\omega_o}} jn\pi}{j\omega + k} \right] \quad (39)$$

$$= \sum_{n=0}^{\infty} \left[ \pi\delta(\omega) + \frac{1}{j\omega} \right] e^{-jn\pi\left(\frac{\omega+\omega_o}{\omega_o}\right)} - \sum_{n=0}^{\infty} \left[ \frac{e^{-jn\pi\left(\frac{\omega+\omega}{\omega_o}\right)}}{j\omega + k} \right] \quad (40)$$

From here it can be seen that the magnitude of $$-jn\pi\left(\frac{\omega + \omega_o}{\omega_o}\right)$$

reaches a maximum when $\omega = \omega_o$. Furthermore, the infinite series in the above equation can be represented analytically because of the following mathematical property:

$$\sum_{n=0}^{\infty} x^n = 1 + x + x^2 + x^3 + x^4 + \ldots = \frac{1}{1 - x} \quad (41)$$

Hence:

$$V_{out}(j\omega) = \left[ \pi\delta(\omega) + \frac{1}{j\omega} \right] \sum_{n=0}^{\infty} e^{-jn\pi\left(\frac{\omega+\omega_o}{\omega_o}\right)} - \frac{1}{j\omega + k} \sum_{n=0}^{\infty} e^{-jn\pi\left(\frac{\omega+\omega_o}{\omega_o}\right)} \quad (42)$$

$$= \left[ \pi\delta(\omega) + \frac{1}{j\omega} - \frac{1}{j\omega + k} \right] \sum_{n=0}^{\infty} e^{-jn\pi\left(\frac{\omega+\omega_o}{\omega_o}\right)} \quad (43)$$

$$= \left[ \pi\delta(\omega) + \frac{1}{j\omega} - \frac{1}{j\omega + k} \right] \left( \frac{1}{1 - e^{-jn\pi\left(\frac{\omega+\omega_o}{\omega_o}\right)}} \right) \quad (44)$$

$$= \left[ \pi\delta(\omega) + \frac{k}{j\omega(j\omega + k)} \right] \left( \frac{e^{jn\pi\left(\frac{\omega+\omega_o}{\omega_o}\right)}}{e^{jn\pi\left(\frac{\omega+\omega_o}{\omega_o}\right)} - 1} \right) \quad (45)$$

It can now be seen that as $\omega \to \omega_o$, Vout $\to \infty$, because the denominator $$\left( e^{jn\pi\left(\frac{\omega+\omega_0}{\omega_0}\right)} - 1 \right) \to 0.$$

However, equation (45) is not entirely true, since the ring oscillator is non-linear, and instead of infinity at the resonance frequency $\omega_o$. So, the linearized form of the ring oscillator can now be represented as an impedance in the following manner:

$$Z_{out}(j\omega) = \frac{V_{out}(j\omega)}{I_{in}(j\omega)} \quad (46)$$

where $Z_{out}(j\omega)$ is the impedance of the ring oscillator and $I_{in}(j\omega)$ is a small pulse of test current that is inserted into the gate of the inverter to obtain $V_{out}$. This pulse can be represented in the frequency domain as the Fourier Transform of $u(t) - u(t - t_d)$ in time domain, which would be:

$$I_{in}(j\omega) = \left[\pi\delta(\omega) + \frac{1}{j\omega}\right] - \left(\left[\pi\delta(\omega) + \frac{1}{j\omega}\right]\right)e^{-j\omega\tau_d} \quad (47)$$

Now the output impedance $Z_{out}(j\omega)$ can be plotted using a program like Matlab or Mathematica.

Figure 8:
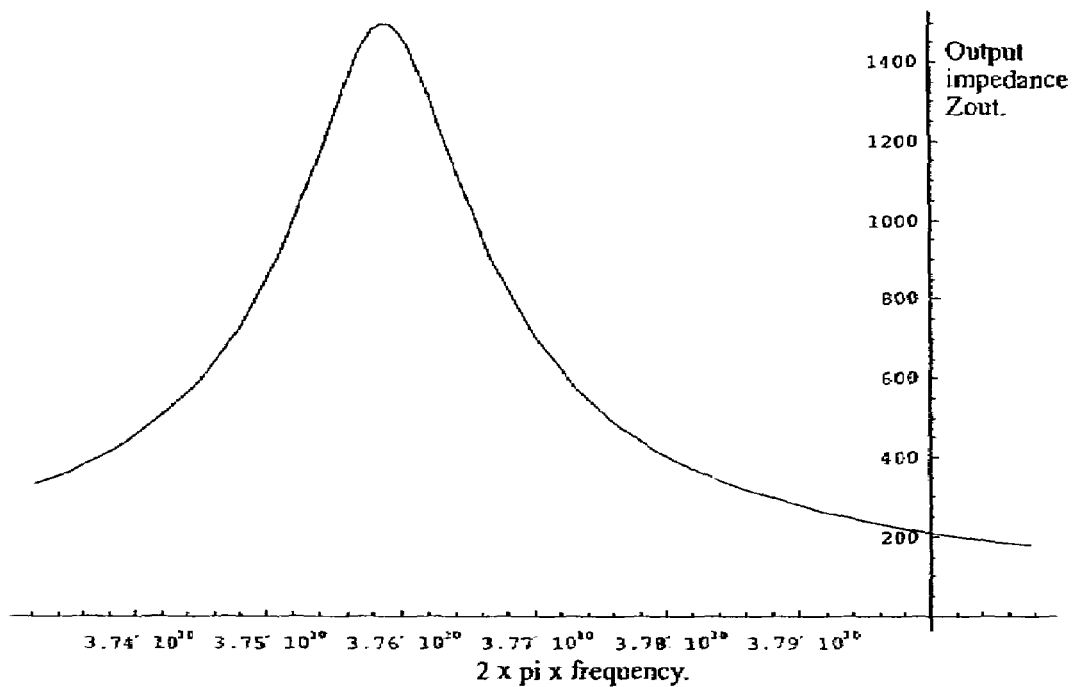
FIG. 8: illustrates a plot showing || at 6 GHz frequency within a 120 MHz BW from the equations in FIG. 7.
Figure 9:
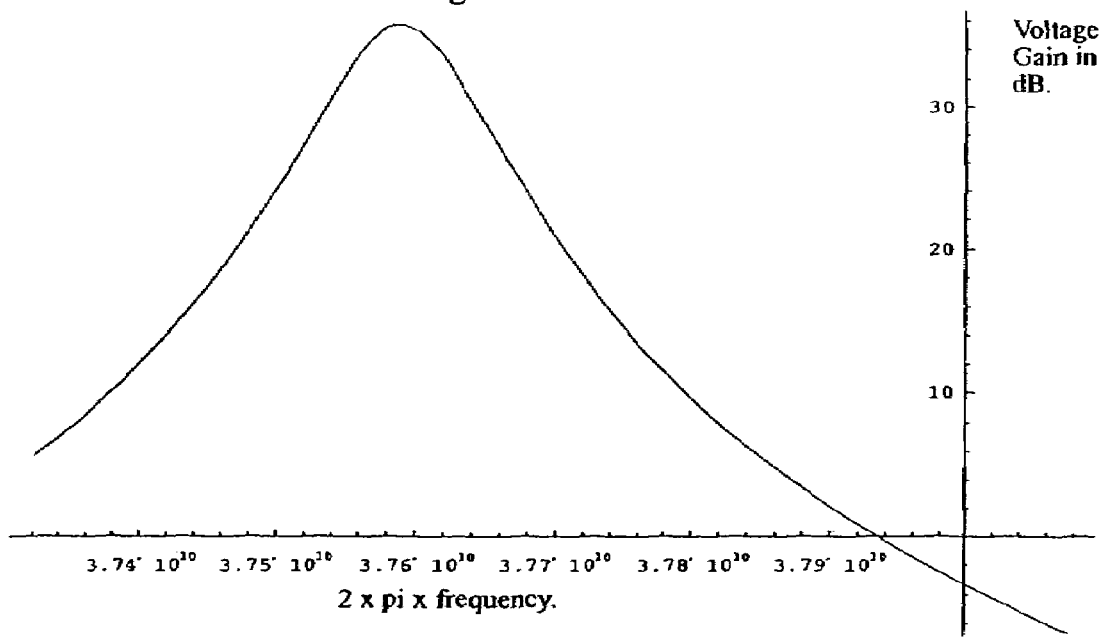
FIG. 9: illustrates a plot showing Gain=20 Log{gm}f=6 GHz frequency, BW=120 MHz from the equations in FIG. 7.

The equations shown in FIG. 7 can be entered into Mathematica to plot $(j\omega)$ and the voltage gain. These are shown in FIG. 8 and FIG. 9 respectively. The plot in FIG. 9 was obtained using $g_m = 0.004 = 4$ mS.

Note that only 0.1×"the line RO" is used to "start" the ring oscillator. This means the ring oscillator has a D.C. gain of $$\frac{1}{0.1} = 10.$$

Also note that the resistor is now replaced by the output impedance of the MOSFET connected in its place, Zamp. Here "z" is the total impedance, i.e. Zamp∥ZoutRO.

Figure 10:
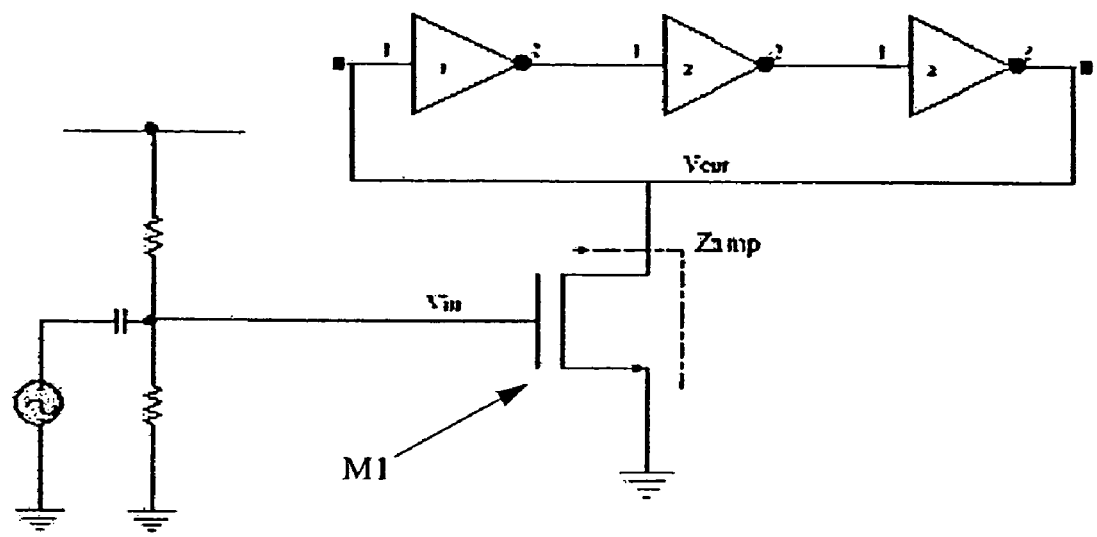
FIG. 10: illustrates a tuned amplifier using an artificial tank in accordance with the teachings of this invention.
Figure 11:
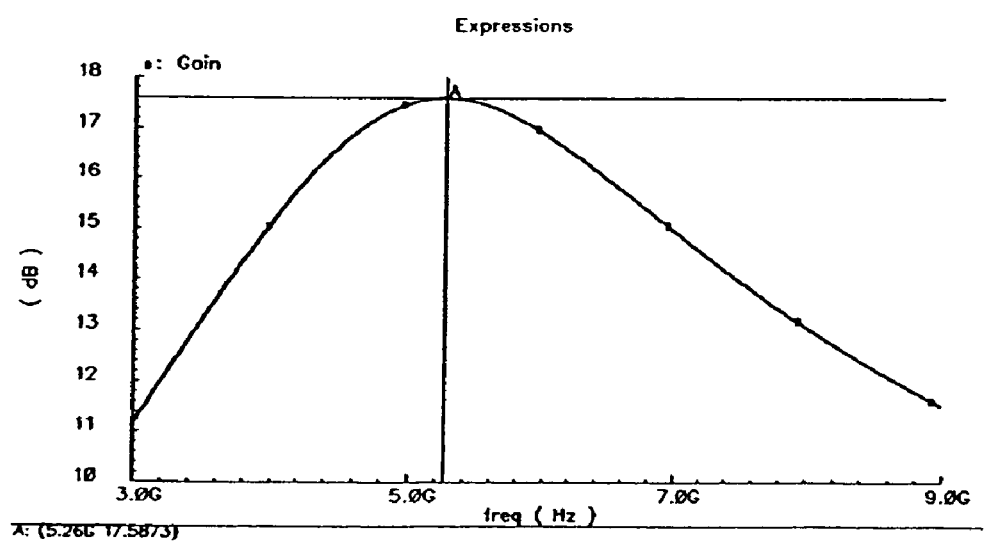
FIG. 11: illustrates a small signal gain of the tuned amplifier shown in FIG 10.

Resistor $R_L$ (shown in FIG. 3) is now replaced by a NMOS transistor M1 biased in saturation with Rds equal to the resistor value, to provide the same amount of stability in the ring oscillator. Finally a signal is applied to the gate of transistor M1 and the result is a tuned amplifier with a voltage gain of about 18 dB. FIG. 10 shows the schematic of a tuned amplifier using an artificial tank. FIG. 11 shows the small signal voltage gain of the tuned amplifier.

It is now clearly seen how the ring oscillator acts like an artificial tank for this transistor. With proper input matching in order to provide the lowest noise figure (NF), this circuit can be converted into a Low Noise Amplifier (LNA).

Figure 12:
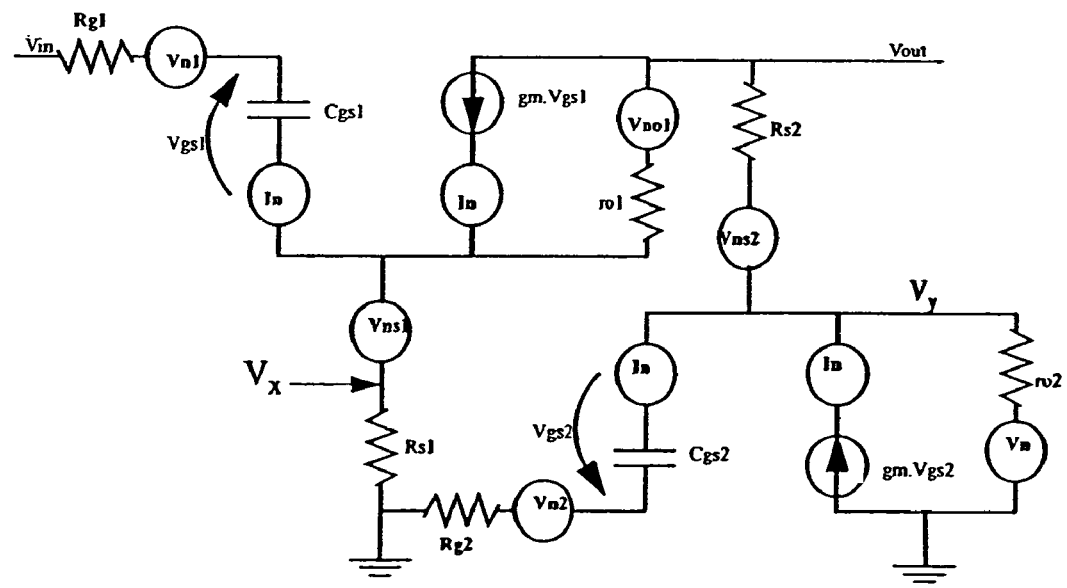
FIG. 12: illustrates a small signal diagram of the common source differential pair with an active load.

Noise Equations for the active load circuit shown in the small-signal diagram of FIG. 12 are derived below. Here the load of the amplifying transistor(s) is the ring oscillator consisting of active loads in a feedback configuration. FIG. 12 shows the small signal diagram of the common source differential-pair with a diode-connected active-load having some of the noise sources in the circuit.

Let the Input Resistance be represented by Rg':

$$R_g' = R_{g1} + \frac{1}{j\omega C_{gs1}} + R_s \quad (48)$$

Vn1 can be given as:

$$V_{n1} = \sqrt{4KTBR_{g1}} \quad (49)$$

The input current to the amplifying transistor gives:

$$\frac{V_{gs1}}{1/j\omega C_{gs1}} = \frac{V_{n1} - V_x}{R_{g1}'} \Rightarrow V_{gs1} = \frac{V_{n1} - V_x}{j\omega C_{gs1} R_{g1}'} \quad (50)$$

The input Current to the active load gate gives:

$$\frac{V_{gs2}}{1/(j\omega C_{gs2})} = \frac{V_y}{R_{g2} + (1/(j\omega C_{gs2}))} \Rightarrow V_{gs2} = \frac{V_y}{1 + j\omega R_{g2} C_{gs2}} \quad (51)$$

Kirchoffs Current Laws at node $V_y$ gives:

$$\frac{V_{out} - V_y}{R_{s2}} = \frac{V_y j\omega C_{gs2}}{1 + j\omega R_{g2} C_{gs2}} + g_{m2} V_{gs2} + \frac{V_y}{r_{o2}} = \quad (52)$$

$$V_y \left[\frac{j\omega C_{gs2}}{1 + j\omega R_{g2} C_{gs2}} + \frac{g_{m2}}{1 + j\omega R_{g2} C_{gs2}} + \frac{1}{r_{o2}}\right]$$

or:

$$\therefore V_y = \frac{V_{out}}{1 + R_{s2}\left[\frac{g_{m2} + j\omega C_{gs2}}{1 + j\omega R_{g2} C_{gs2}} + \frac{1}{r_{o2}}\right]} \approx \frac{V_{out}}{1 + g_{m2} R_{s2}} \quad (53)$$

since $j\omega C_{gs2} \approx 0$ and $\frac{1}{r_{o2}} \approx 0$. $\quad (54)$ Substituting (50) for $V_{gs1}$ and calculating the KCL at node $V_x$ gives:

$$\frac{V_x}{R_{s1}} = \frac{g_{m1}(V_{n1} - V_x)}{j\omega C_{gs1} R_{g1}'} + \frac{V_{out} - V_x}{r_{o1}} + \frac{V_{n1} - V_x}{R_{g1}'} \Rightarrow V_x = \quad (55)$$

$$\frac{\frac{V_{n1}}{R_{g1}'} + \frac{g_{m1} V_{n1}}{j\omega C_{gs1} R_{g1}'} + \frac{V_{out}}{r_{o1}}}{\frac{1}{R_{s1}} + \frac{1}{R_{g1}'} + \frac{g_{m1}}{j\omega C_{gs1} R_{g1}'} + \frac{1}{r_{o1}}}$$

Hence:

$$V_x = \frac{V_{n1}\left(\frac{g_{m1} + j\omega C_{gs1}}{j\omega C_{gs1} R_{g1}'}\right) + \frac{V_{out}}{r_{o1}}}{k_o} \approx \frac{\frac{g_{m1} V_{n1}}{j\omega C_{gs1} R_{g1}'} + \frac{V_{out}}{r_{o1}}}{k_o} \quad (56)$$

where $$k_o = \frac{1}{R_{s1}} + \frac{j\omega C_{gs1} + g_{m1}}{j\omega C_{gs1} R_{g1}'} + \frac{1}{r_{o1}} \approx \frac{1}{R_{s1}} + \frac{g_{m1}}{j\omega C_{gs1} R_{g1}'} \quad (57)$$

since $$\frac{1}{r_{o1}} \approx 0 \text{ and } j\omega C_{gs1} \approx 0. \quad (58)$$

Now substituting (56) into (50), we get:

$$V_{gs1} = \frac{V_{n1} k_o - \left(\frac{V_{n1}(j\omega C_{gs1} + g_{m1})}{j\omega C_{gs1} R_{g1}'} + \frac{V_{out}}{r_{o1}}\right)}{j\omega C_{gs1} R_{g1}'\left(\frac{1}{R_{s1}} + \frac{g_{m1}}{j\omega C_{gs1} R_{g1}'}\right)} = \quad (59)$$

$$\frac{V_{n1}\left(k_o - \frac{j\omega C_{gs1} + g_{m1}}{j\omega C_{gs1} R_{g1}'}\right) - \frac{V_{out}}{r_{o1}}}{\frac{j\omega C_{gs1} R_{g1}'}{R_{s1}} + g_{m1}} \approx \frac{\frac{V_{n1}}{R_{s1}} - \frac{V_{out}}{r_{o1}}}{g_{m1}}$$

-continued $$V_{gs1} \approx \frac{\frac{V_{n1}}{R_{s1}} - \frac{V_{out}}{r_{o1}}}{g_{m1}} \quad (60)$$

KCL at $V_{out}$ gives:

$$g_{m1}V_{gs1} + \frac{V_{out} - V_x}{r_{o1}} = \frac{V_{out} - V_y}{R_{s2}} \quad (61)$$

$$\frac{V_{n1}}{R_{s1}} - \frac{V_{out}}{r_{o1}} + \frac{V_{out} - \left(\frac{g_{m1}V_{n1}}{j\omega C_{gs1}R'_{g1}} + \frac{V_{out}}{r_{o1}}\right)}{r_{o1}} = \frac{V_{out} - \frac{V_{out}}{1+g_{m2}R_{s2}}}{R_{s2}} \quad (62)$$

$$\frac{V_{n1}}{R_{s1}} - \frac{\left(\frac{g_{m1}V_{n1}}{j\omega C_{gs1}R'_{g1}} + \frac{V_{out}}{r_{o1}}\right)}{r_{o1}\left(\frac{1}{R_{s1}} + \frac{g_{m1}}{j\omega C_{gs1}R'_{g1}}\right)} = \frac{V_{out} - \frac{V_{out}}{1+g_{m2}R_{s2}}}{R_{s2}} \quad (63)$$

$$V_{out} = \quad (64)$$

$$\frac{\frac{V_{n1}}{R_{s1}} - \frac{g_{m1}V_{n1}}{j\omega C_{gs1}R'_{g1}}}{r_{o1}\left(\frac{1}{R_{s1}} + \frac{g_{m1}}{j\omega C_{gs1}R'_{g1}}\right)} \approx \frac{\frac{V_{n1}}{R_{s1}} - \frac{g_{m1}V_{n1}}{j\omega C_{gs1}R'_{g1}}}{r_{o1}\left(\frac{1}{R_{s1}} + \frac{g_{m1}}{j\omega C_{gs1}R'_{g1}}\right)}$$

$$\frac{1}{r_{o1}^2\left(\frac{1}{R_{s1}} + \frac{g_{m1}}{j\omega C_{gs1}R'_{g1}}\right)} + \frac{1 - \frac{1}{1+g_{m2}R_{s2}}}{R_{s2}} \approx \frac{1}{R_{s2}}$$

Since:

$$\frac{1}{r_{o1}^2} \approx 0 \text{ and } \frac{1}{j\omega C_{gs1}} \approx \infty, \text{ and } 1 - \frac{1}{1+g_{m2}R_{s2}} = \frac{g_{m2}R_{s2}}{1+g_{m2}R_{s2}} \approx 1 \quad (65)$$

$$V_{out} = V_{n1}\left(\frac{R_{s2}r_{o1}\left(\frac{1}{R_{s1}} + \frac{g_{m1}}{j\omega C_{gs1}R'_{g1}}\right) - \frac{R_{s2}R_{s1}g_{m1}}{j\omega C_{gs1}R'_{g1}}}{R_{s1}r_{o1}\left(\frac{1}{R_{s1}} + \frac{g_{m1}}{j\omega C_{gs1}R'_{g1}}\right)}\right) \quad (66)$$

$$V_{out} = V_{n1}\left(\frac{j\omega C_{gs1}R'_{g1}R_{s2}r_{o1} + (r_{o1} - R_{s1})R_{s2}R_{s1}g_{m1}}{r_{o1}R_{s1}(j\omega C_{gs1}R'_{g1} + R_{s1}g_{m1})}\right) \quad (67)$$

$$V_{out} \approx V_{n1}\left(\frac{j\omega C_{gs1}R'_{g1}R_{s2}r_{o1} + (r_{o1} - R_{s1})R_{s2}R_{s1}g_{m1}}{r_{o1}R_{s1}^2 g_{m1}}\right) \quad (68)$$

$$V_{out} \approx V_{n1}\left(\frac{j\omega C_{gs1}R'_{g1}R_{s2}}{R_{s1}^2 g_{m1}} + \frac{R_{s2}}{R_{s1}}\right) \quad (69)$$

since:

$$j\omega C_{gs1}R'_{g1} \approx 0 \text{ and } (r_{o1} - R_{s1}) \approx r_{o1} \text{ because } r_{o1} >> R_{s1} \quad (70)$$

This shows the direct dependency of the output noise voltage to $C_{gs1}$, the input impedance $R_{g1}$, and inverse dependency to the amplifying transistor's transconductance $g_{m1}$. This $V_{out}$ is equivalent to $V_{on1}$ which is the output noise voltage caused by the thermal noise of $R_{g1}$. Now the output noise voltage caused by source resistance, $R_s$, is:

$$V_{ons} = \frac{V_{out}}{V_{n1}} \times V_{ns}, \text{ where } V_{ns} = \sqrt{4KTBR_s} \quad (71)$$

Now use super-position to calculate $V_{ons1}$, the output noise voltage due to $R_{s1}$, by setting $V_{n1}$ and $V_{ns}$ equal to zero $$-V_{gs1} = \frac{V_{ns1}}{j\omega C_{gs1}R'_{g1}} \quad (72)$$

KCL at $V_x$ gives:

$$\frac{V_{ons1} - V_{ns1}}{r_{o1}} + g_{m1}V_{gs1} = \frac{V_{ns1}}{R_{s1}} \quad (73)$$

$$\frac{V_{ons1} - V_{ns1}}{r_{o1}} - \frac{g_{m1}V_{ns1}}{j\omega C_{gs1}R_{g1'}} = \frac{V_{ns1}}{R_{s1}} \quad (74)$$

Hence:

$$V_{ons1} = V_{ns1}r_{o1}\left(\frac{1}{r_{o1}} + \frac{g_{m1}}{j\omega C_{gs1}R'_{g1}} + \frac{1}{R_{s1}}\right) \text{ where } V_{ns1} = \sqrt{4KTBR_{s1}} \quad (75)$$

Again, use super-position to calculate $V_{on2}$, the output noise voltage due to $R_{g2}$, setting $V_{n1}$, $V_{ns}$, and $V_{ns1}$ equal to zero, the noise voltage at $V_y$ due to $R_{g2}$ is given by the voltage divider:

$$\frac{V_y R_{g2}}{R_{g2} + (1/j\omega C_{gs2})} = V_{n2} \quad (76)$$

$$V_y - V_{n2} = V_{n2}\left(\frac{1}{j\omega C_{gs2} R_{g2}}\right) \quad (77)$$

Hence:

$$V_y = \frac{V_{n2}}{R_{g2}}\left(R_{g2} + \frac{1}{j\omega C_{gs2}}\right) \quad (78)$$

where:

$$V_{n2} = \sqrt{4KTBR_{g2}} \quad (79)$$

Now KCL at $V_y$ gives:

$$\frac{V_{on2} - V_y}{R_{s2}} = \frac{V_y - V_{n2}}{(1/j\omega C_{gs2})} + \frac{V_y}{r_{o2}} + g_{m2}(V_y - V_{n2}) \quad (80)$$

Substituting (78) into (80) gives:

$$\frac{V_{on2} - V_{n2}\left(1 + \frac{1}{j\omega R_{g2} C_{gs2}}\right)}{R_{s2}} = \quad (81)$$

$$\frac{V_{n2}\left(\frac{1}{j\omega C_{gs2} R_{g2}}\right)}{(1/j\omega C_{gs2})} + \frac{V_{n2}\left(1 + \frac{1}{j\omega R_{g2} C_{gs2}}\right)}{r_{o2}} + g_{m2} V_{n2}\left(\frac{1}{j\omega C_{gs2} R_{g2}}\right)$$

$$\frac{V_{on2} - V_{n2}\left(1 + \frac{1}{j\omega R_{g2} C_{gs2}}\right)}{R_{s2}} = \quad (82)$$

$$\frac{V_{n2}}{R_{g2}} + \left(\frac{V_{n2}}{r_{o2}} + g_{m2} V_{n2}\right)\left(\frac{1}{j\omega R_{g2} C_{gs2}}\right) + \frac{V_{n2}}{r_{o2}}$$

Hence:

$$V_{on2} = V_{n2} R_{s2}\left(\frac{1}{R_{g2}} + \left(\frac{1}{r_{o2}} + g_{m2}\right)\left(\frac{1}{j\omega R_{g2} C_{gs2}}\right) + \frac{1}{r_{o2}} + \frac{\left(1 + \frac{1}{j\omega R_{g2} C_{gs2}}\right)}{R_{s2}}\right) \quad (83)$$

Now since $$\frac{1}{r_{o1}} \approx 0:$$

$$V_{on2} \approx V_{n2} R_{s2}\left(\frac{1}{R_{g2}} + \frac{g_{m2}}{j\omega R_{g2} C_{gs2}} + \frac{1}{R_{s2}}\left(1 + \frac{1}{j\omega R_{g2} C_{gs2}}\right)\right) \quad (84)$$

Finally, neglecting the noise voltages from $r_{o1}, r_{o2}$ and $R_{s2}$, (because there are not amplified) the total output noise power becomes:

$$V_{on}^2 = V_{on1}^2 + V_{on2}^2 + V_{ons1}^2 \quad (85)$$

and the NF of the amplifier is:

$$NF = \frac{V_{on}^2}{V_{ons}^2} \text{ where } V_{ons}^2 = \frac{V_{on1}^2}{V_{n1}^2} \times \sqrt{4KTBR_s} \quad (86)$$

Phase noise generally occurs in ring oscillators when amplitude noise is added to the circuit by thermal, shot, and/or flicker noise during the transition of the signal voltage or current from Vdd to Ground or vice-versa. The amplitude noise makes the transition either faster or slower than it should be without the noise input. This in turn makes the successive transition faster and/or slower depending on the noise inputs during earlier transitions. Thus this time shift in the transitions creates phase noise, since the exact moment of the transitions becomes random. The transitions accumulate over time because each previous noise input affects the present time of transition and the future tine as well. However, phase noise in a tuned ring oscillator amplifier such as this LNA is not extremely significant because:

1. the ring oscillator is used at the output of the amplifier.
2. the transitions of the signal at the output is directly controlled by the input signal at the amplifying transistor, unlike a ring oscillator which runs freely without any external or independent input signal.
3. external noise sources have already been reduced by the input matching and the high output signal to noise ratio of the amplifier.

Thus, the phase noise should not be a great concern for the LNA design in accordance with this invention.

In order to improve linearity of the LNA, instead of making the input transistors linear, the artificial tank that was created for the tuned LNA was made linear by putting source resistors in the differential ring oscillator artificial tank. The result was that even though the drain current of the input differential pair transistors was increased, the current through the artificial tank remained relatively constant for a limited input power level, thus increasing the circuits' 1-dB compression points. Thus linearity was maintained up to an input power of −20 dBm. This also provides to minimize the chip area and design the LNA without the use of inductors.

Alternatively, another way to improve linearity of the LNA is to put source resistances Rs or source inductor Ls. This increases the source voltage of the input transistor when the current Id increases as a result of the increase in input gate voltage, Vg. This in turn reduces Vgs and thus Id, therefore providing the negative feedback needed to maintain a linear circuit.

Output matching was accomplished using appropriate current sources and source follower buffers so that the output impedance seen would be $1/g_m = 50$ ohms.

In one embodiment, the ring oscillator LNA was made differential by connecting the outputs of the amplifying transistors forming a differential pair to the output nodes of a differential ring oscillator. This increases the frequency response because the differential structure makes some of the parasitic capacitances in the NMOS devices which are connected to ground to be divided by two. This doubles the frequency of operation. There is a disadvantage of using the differential structure in that the differential ring oscillator LNA requires a constant current (3×250 uA) supply. This is due to the current sources used in the differential structure, thus providing a need for static power. In the single ended structure, the static power is almost zero because under the static condition, the ring oscillator power consumption is almost zero, which prolongs battery life. However, the advantage of added linearity is much more desirable.

In order to reduce the size of the differential ring oscillator, which was used as the load for the differential LNA, the resistive loads in the differential ring oscillator were replaced by active loads composed of diode-connected NMOS transistors. Adjustments were made in the sizes of the active load transistors and the sizes of the input differential pair transistors to obtain damped oscillations at the correct frequency for a short voltage pulse input at the gates of the input differential pair transistors.

Design Procedure

The following procedure was used to design the differential ring oscillator LNA in accordance with the teachings of this invention. An object of embodiments in accordance with this invention is to create an LNA in CMOS technology, with acceptable parameters for the 802.11 a wireless LAN standards, without the use of inductors on the integrated circuit by substituted the LC-tank. Embodiments of this invention provide an artificial tank which reduces chip-area and maintains a high-Q tank circuit.

In general, before designing a circuit, its target specifications must be selected in order to obtain the correct parameters for the design. The LNA design in accordance with the teachings of this invention is based on the 802.11a standard which the 100 MHz BW segment from 5.725 to 5.825 GHz. Table 1 shows the target specifications for the LNA design.

TABLE 1

LNA SPECIFICATIONS

| Specification Type | Value range |
|---|---|
| Center Frequency | 5.9 GHz to 6 GHz |
| Bandwidth | 150 MHz |
| Power Gain (S21) | 8.5 dB |
| Current Consumption | <3 mA |
| Voltage supply | 1.8 V |
| 1 dB Compression Point | > −20 dBm |
| Input referred IP3 | > −14 dBm |
| Noise Figure | <4 dB |
| S11 | < −10 dB |
| S22 | < −10 dB |

The technology used for the LNA design in accordance with teachings of this invention has a MOSFET gate length required for good performance at the high operating frequencies. The gate length MOSFET technology that has well-defined simulation models is the TSMC CMOS 0.18-micrometer (micron) process. This technology requires a minimum grid spacing of 0.005 microns (μm). The documentation provided from CMC shows that the unity gain frequency for this technology is about 70 GHz and the minimum NF for a minimum-sized NMOS transistor is about 0.0005 dB.

The circuit was made using only using NMOS transistors since it is known that the electron mobility is about three times higher than that of holes. Thus smaller NMOS transistors obtain the same operational frequency compared to a circuit with PMOS transistors, or both NMOS and PMOS transistors. This minimizes the size of the LNA on the layout. Also, the NMOS transistors provide a lower NF for the circuit.

Although the bluetooth 802.11a wireless LAN, UNI 3 band specifications say that the center frequency of this LNA is supposed to cover 5.725-5.825 GHz, the schematic simulations were intentionally designed for a frequency band 80 to 100 MHz higher so that $f_c \approx 6$ GHz.

First a differential ring oscillator was designed using three identical differential inverters with an oscillation frequency of 6 GHz. The current sources of the differential ring oscillator inverters were increased to give the correct oscillation frequency. Then the diode connected NMOS transistors were used to replace the load resistors of the inverters in the differential ring oscillator. After that, D.C. simulations were run while varying the widths of the diode connected NMOS transistors and the differential inverter transistors to ensure 0.9 volts at the output of the differential ring oscillator inverters and maximum voltage swing at the output of the LNA.

An NMOS differential pair (NDP), accompanied with the appropriate current source was designed as the amplifier in the differential ring oscillator LNA. The drains of the NDP transistors were connected to the output of the differential ring oscillator (i.e. to two of the diode connected NMOS transistors of one of the differential inverters in the differential ring oscillator). Since more current flowed through the NDP transistors, these diode connected NMOS transistors, which were connected to the differential inverter in the differential ring oscillator, were replaced by smaller resistors so that the voltage at the drains of NDP transistors remained at 0.9 volts. A piece-wise linear voltage source (VPWL) was connected to the gates of the NDP transistors. The VPWL was configured so that it would give a short pulse and then maintained zero volts after the pulse.

Transient simulations were run and the widths of the NDP transistors were increased until damped oscillations were obtained from the differential ring oscillator at 6 GHz. The width of the current source transistor was also increased to give the appropriate 1-dB compression and IP3 points.

Finally, the widths of the NDP transistors chosen were the ones closest to 2.5 μm×4, 8, 16, 32, 64, or 128 due to the limitations of the RF models provided by Cadence and CMC. Off-chip input matching components were inserted to give the highest power transfer and power gain at 6 GHz. A buffer with an output impedance of $1/g_m = 50$ ohms was made to provide output matching for the LNA.

Time Domain Analysis of the Functioning of the Artificial Tank

The time step-by-step time-domain analysis of the LC-tank was discussed above. Here the time domain analysis of the functioning of an artificial tank shown in FIG. 10 is discussed. This analysis is shown in FIG. 13, where transistor M1 is the amplifying NMOS transistor, and Vout is the voltage output at the drain of transistor M1.

It is easily seen from FIG. 13 how the storage of the energy in the artificial tank is "virtual" and not real because the electrical-energy is time-delayed in the ring oscillator to provide the illusion of energy-storage, therefore having the same effect as having an LC-tank.

Choosing Transistor Widths

In one embodiment, the differential ring oscillator inverter transistors widths were chosen to give the correct oscillation frequency. Damped oscillations were obtained by just increasing the active load width to 1.4 µm. This gives a frequency of 10 GHz. As the width of the load is decreased, the amplitude of the oscillation increases, and the frequency of the oscillation decreases to 6 GHz. After the adjustments of the desired width, the closest size was chosen for 2.5 µm×4, 8, 16, 32, 64, or 128.

To improve linearity, the current of the input differential pair transistors was increased by 4 and the load by 4. This increases the 1 dB compression point to −27 dBm with a power gain of 9 dB while keeping the NF less than 2 dB at 6 GHz. This is achieved with matching elements L1=5 nH, and C1=51 fF, and with the input differential pair transistors biased at 0.9V for the gate voltage Vg.

Choosing Gate Biasing Resistors

In order to increase the IP3 and/or the P-1 dB points of the LNA, the biasing resistor (Rbias) values would have to be decreased from 100 Kohms to less than 10 Kohms (to decrease compression due to the input components). This would result in aP-1 dB=−15 dBm for a current source of 64×2.5 µm, and width L1=6.17 nH and C1=30 fF arranged at the input for off-chip matching. However, this result in a low voltage gain of 10 dB, a S21 of 0 dB, and a NF of 5 dB (approx). It is not appropriate to sacrifice the voltage gain and NF for a higher compression point, therefore this was not done.

In order to reduce the number of components used for input matching, the values of the Rbias resistors used to set the gate voltage of the input differential pairs were swept so that Zin (real) is 50 ohms. Hence no C1 is required, and therefore the input did not oscillate or compress as much as before. This value was obtained to be 42.9 Kohms for CS=128×2.5 µm. The L1 off-chip matching inductor was swept and found to be 13.18 nH for a minimal S11. The D.C. current of the LNA was now reduced to 2 mA.

Initial Simulation Results

Figure 14:
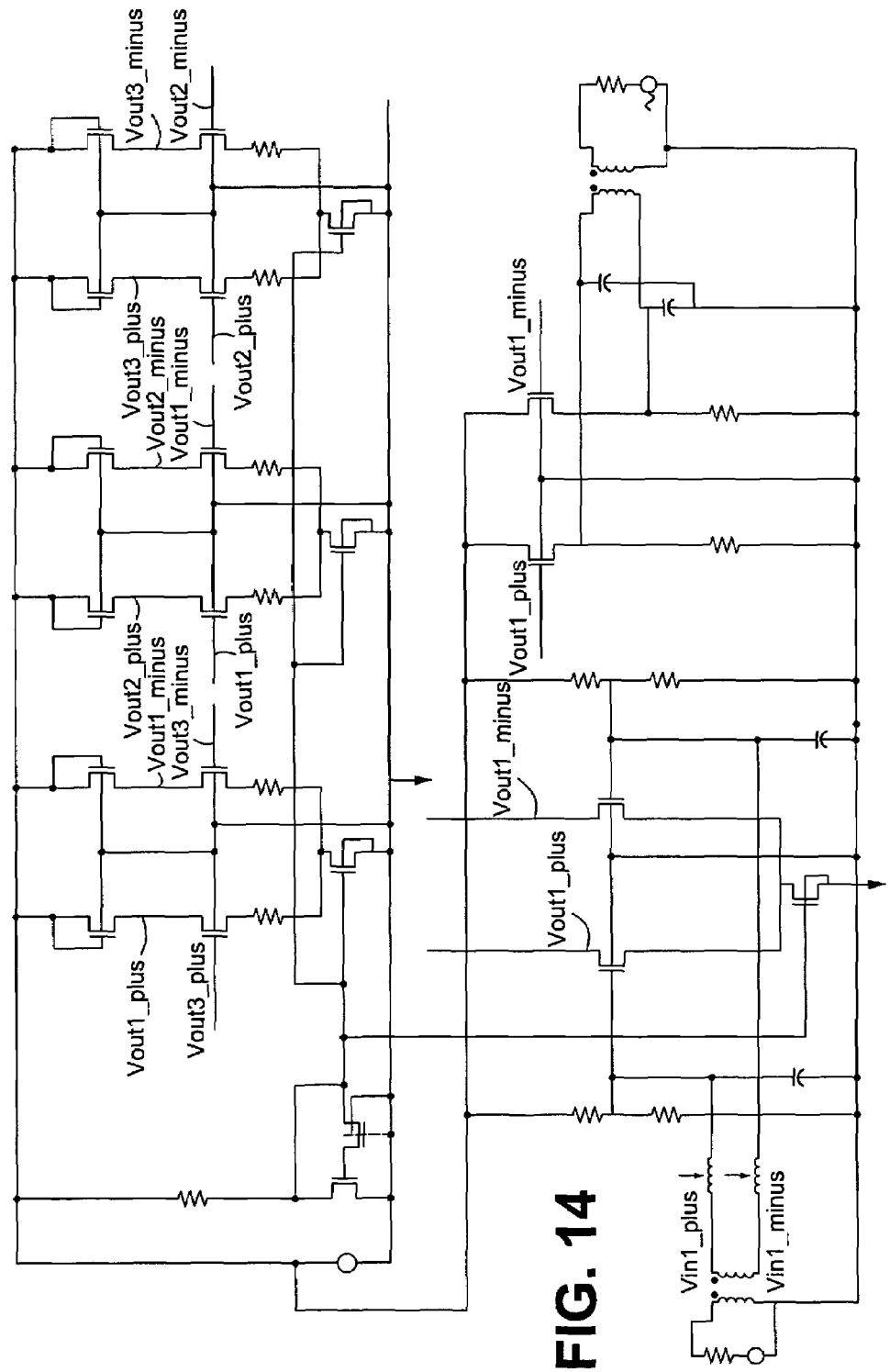
FIG. 14: illustrates a ring oscillator low noise amplifier (LNA) schematic in accordance with the teachings of this invention.
Figure 15:
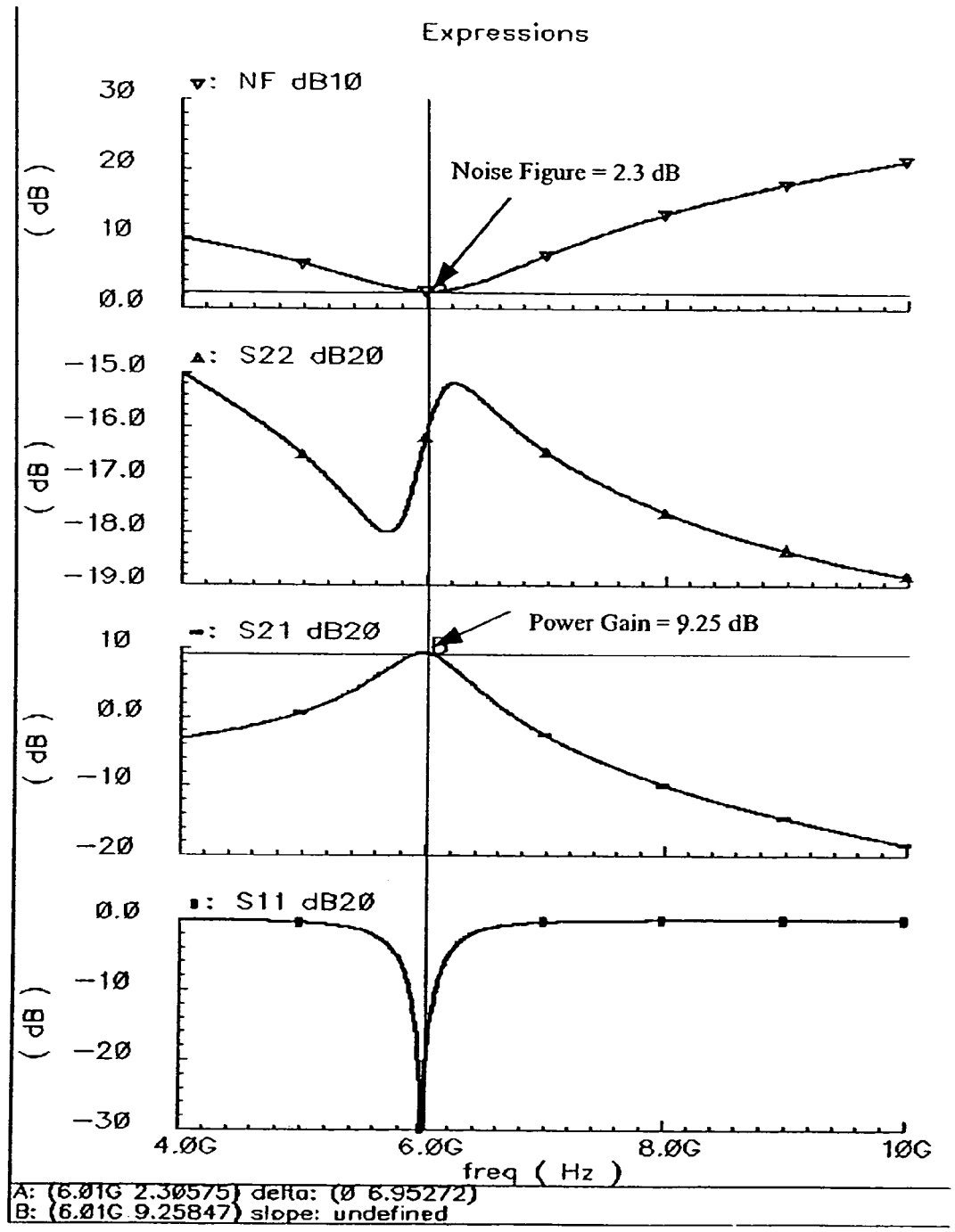
FIG. 15: illustrates a ring oscillator LNA S-parameter plot.
Figure 16:
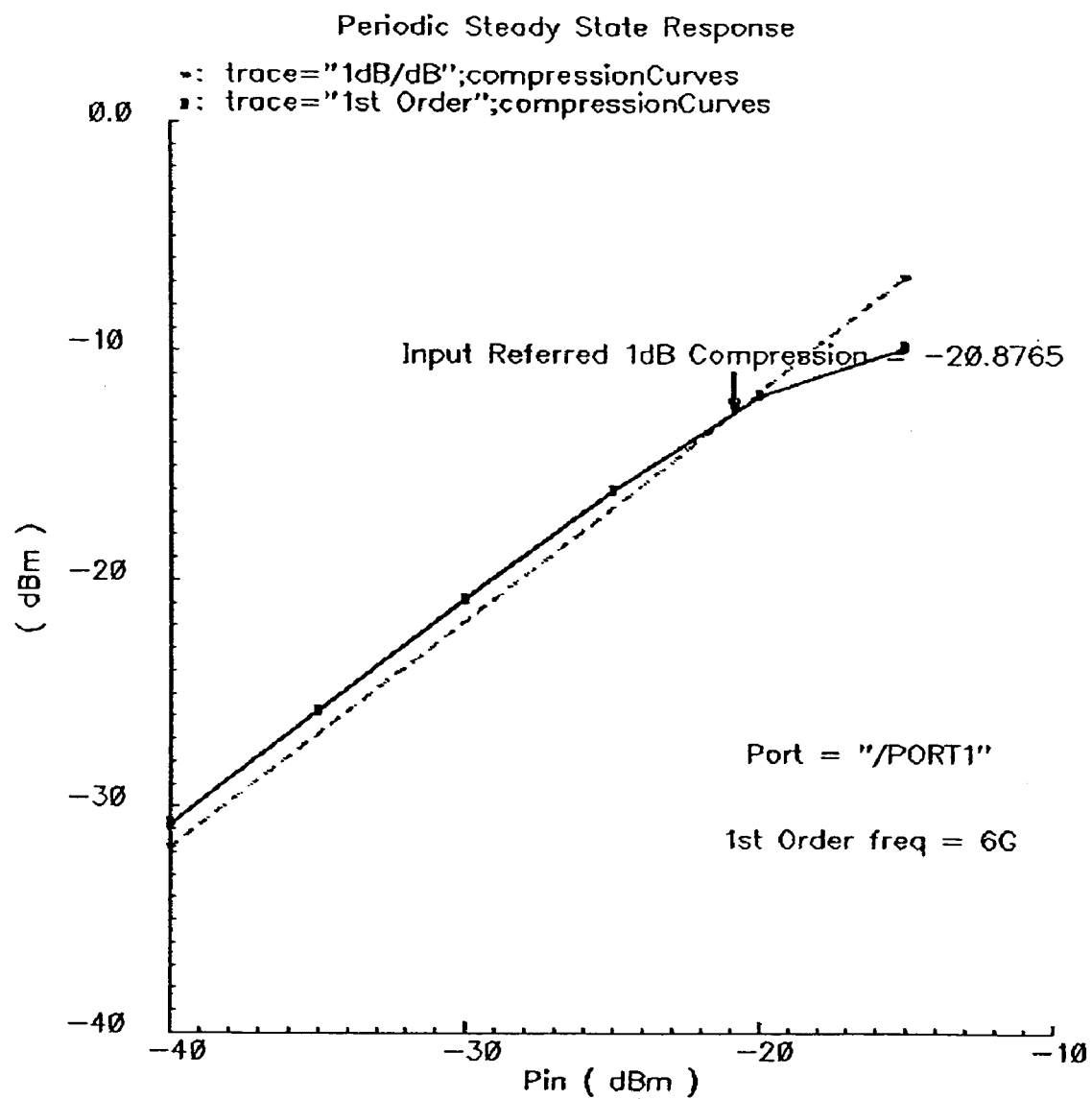
FIG. 16: illustrates the P-1 dB plot of the ring oscillator LNA at the output port after the buffer.
Figure 17:
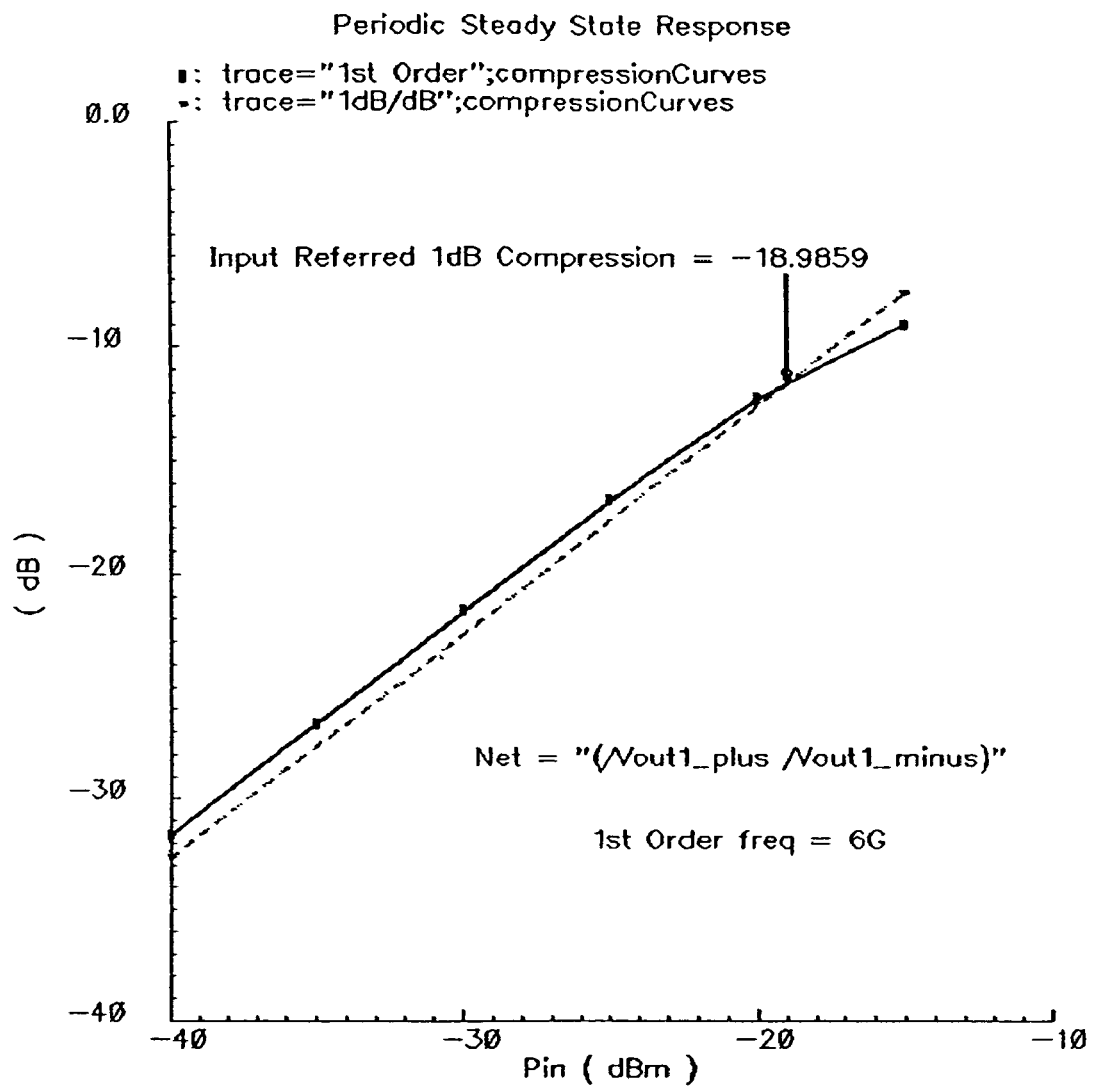
FIG. 17: illustrates the P-1 dB plot of the ring oscillator LNA at the output nets before the buffer.

The schematic of the differential ring oscillator LNA that was used to obtain the simulation results in shown in FIG. 14. FIG. 15 shows the S-parameter plots obtained from simulations in Cadence. The S-parameters show that the differential ring oscillator LNA circuit has its input and output matched to 50 ohms (|S11| and |S22|<−10 dB), and has a power gain of 9.25 dB, and Noise Figure of 2.3 dB. FIG. 17 shows the 1-dB compression point of the differential ring oscillator LNA without at the buffer to be 18.9 dBm, while FIG. 16 shows the 1-dB compression point of the differential ring oscillator LNA after the buffer to be 20.9 dBm, yielding a 1-dB increase in compression due to the buffer.

Figure 20:
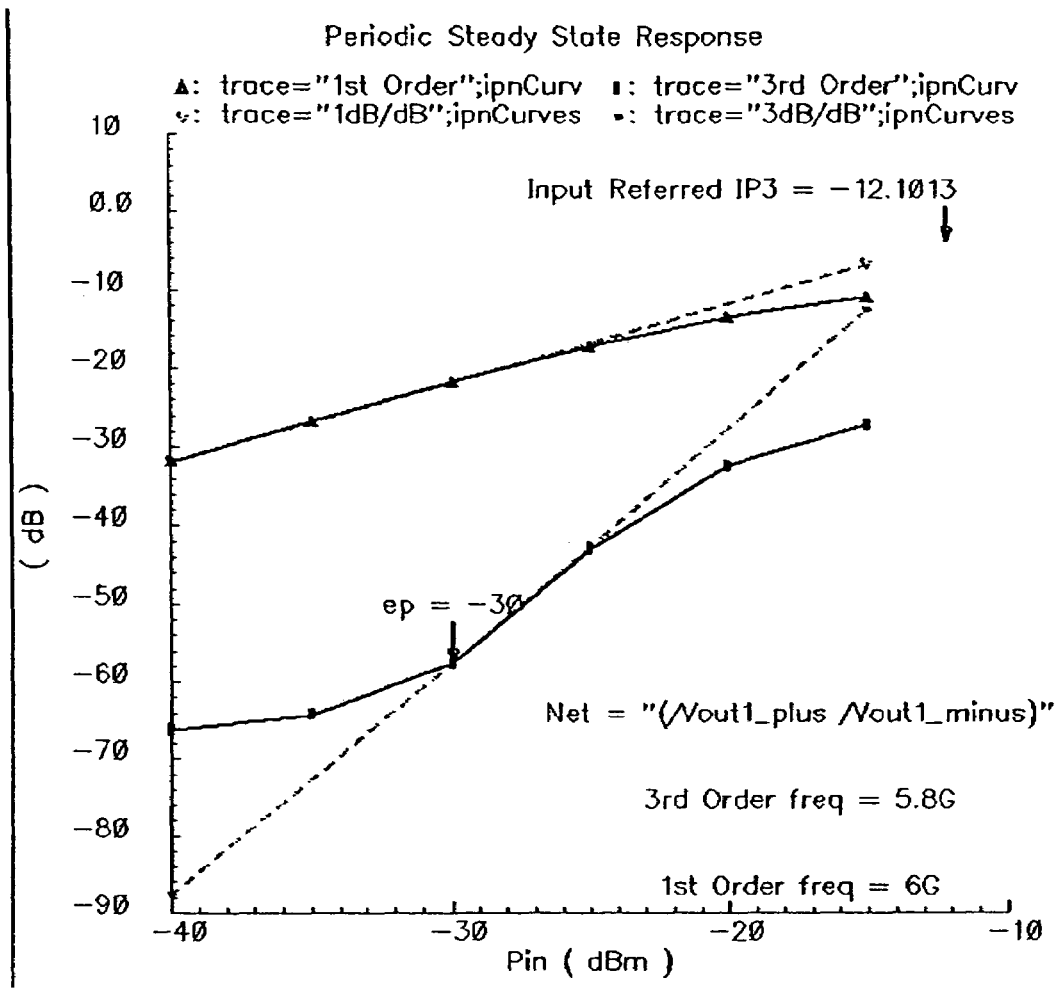
FIG. 20: illustrates a ring oscillator LNA IP3 plot@output nets before the buffer with 3rd order freq=5.8 GHz.
Figure 21:
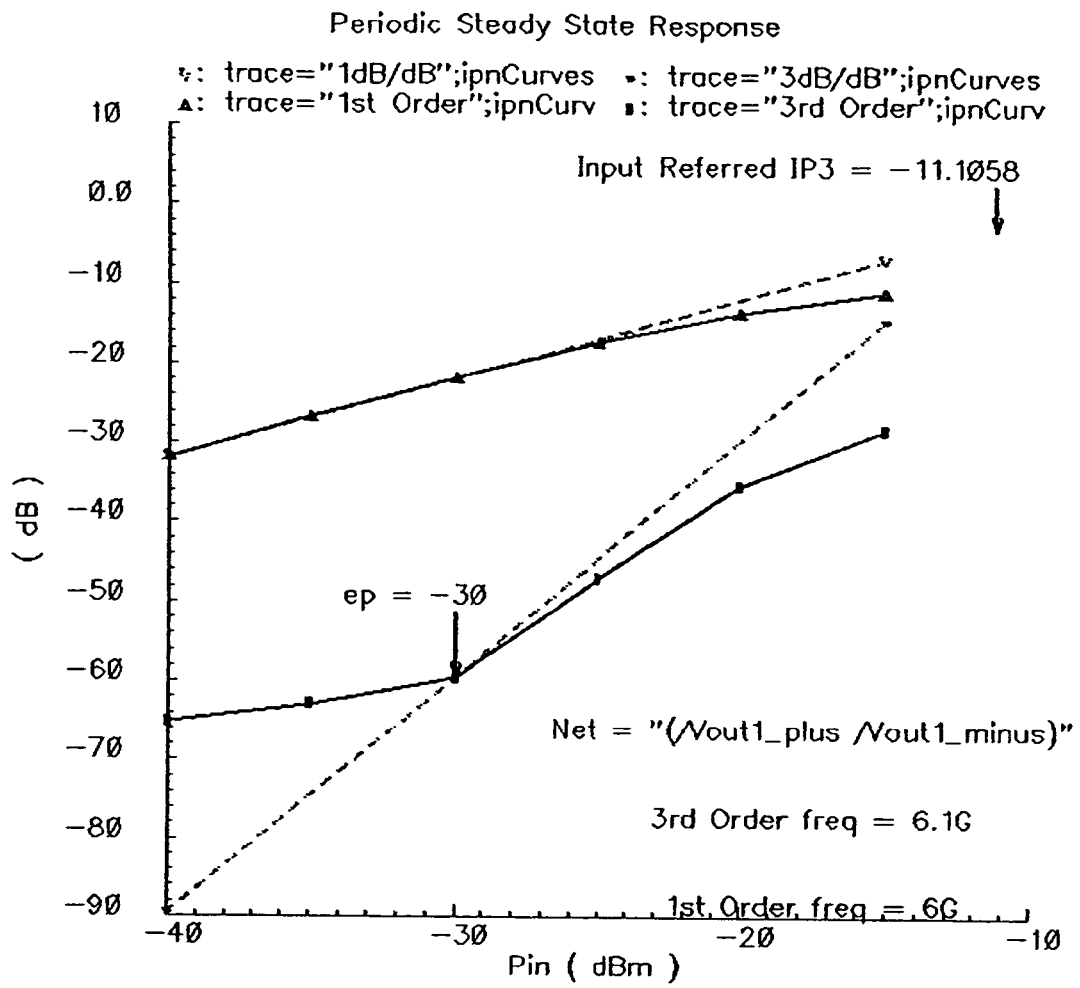
FIG. 21: illustrates a ring oscillator LNA IP3 plot@output nets before the buffer with 3rd order freq=6.1 GHz.

The frequencies used for the IP3 simulations were 5.9 GHz and 6 GHz. Before the buffer was added, the IP3 point obtained from extrapolating the 3rd order output power of 5.8 GHz was −12.1 dBm as shown by FIG. 20, while FIG. 21 shows the IP3 point obtained from extrapolating the 3rd order output power of 6.1 GHz at −11.1 dBm.

Figure 18:
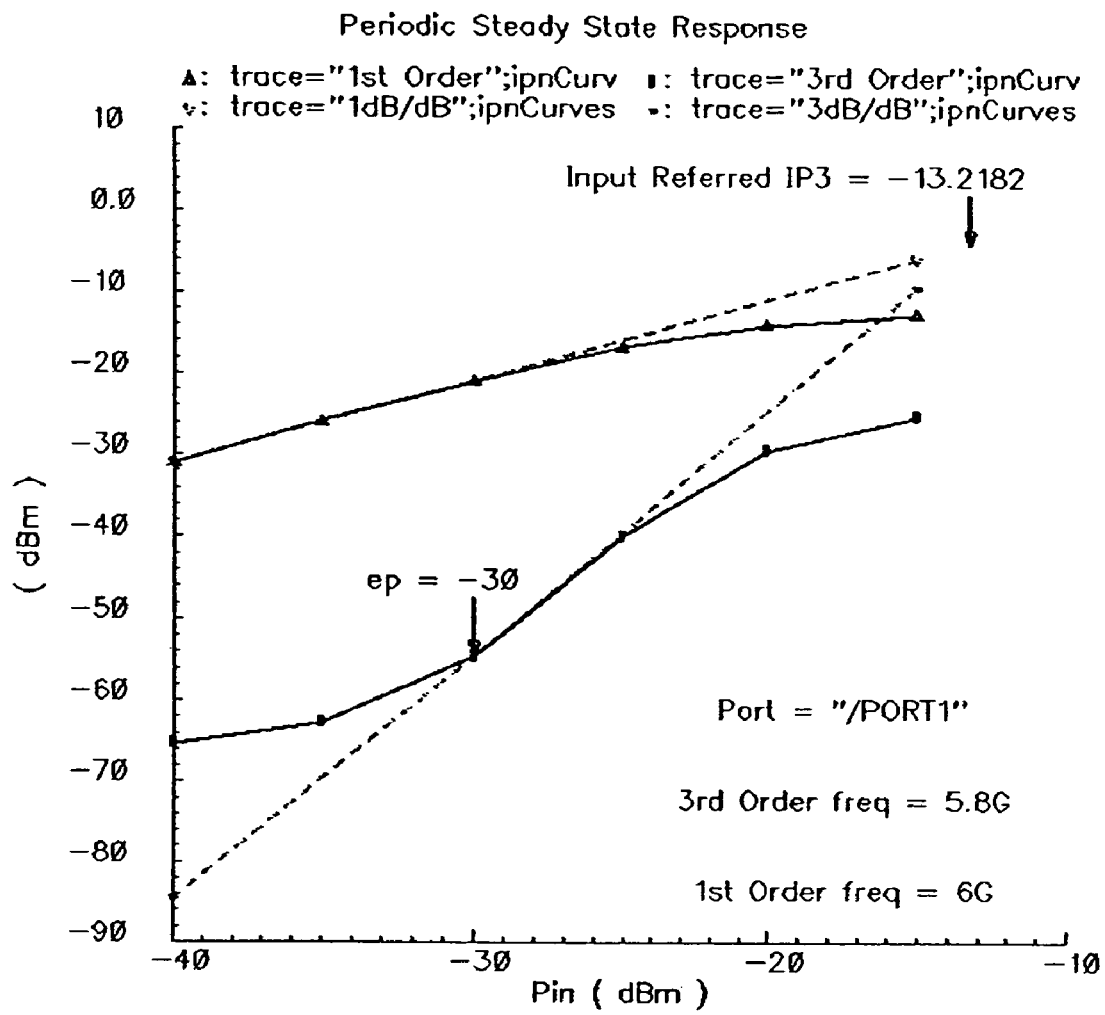
FIG. 18: illustrates a ring oscillator LNA IP3 plot@output port with 3rd order frequency=5.8 GHz.
Figure 19:
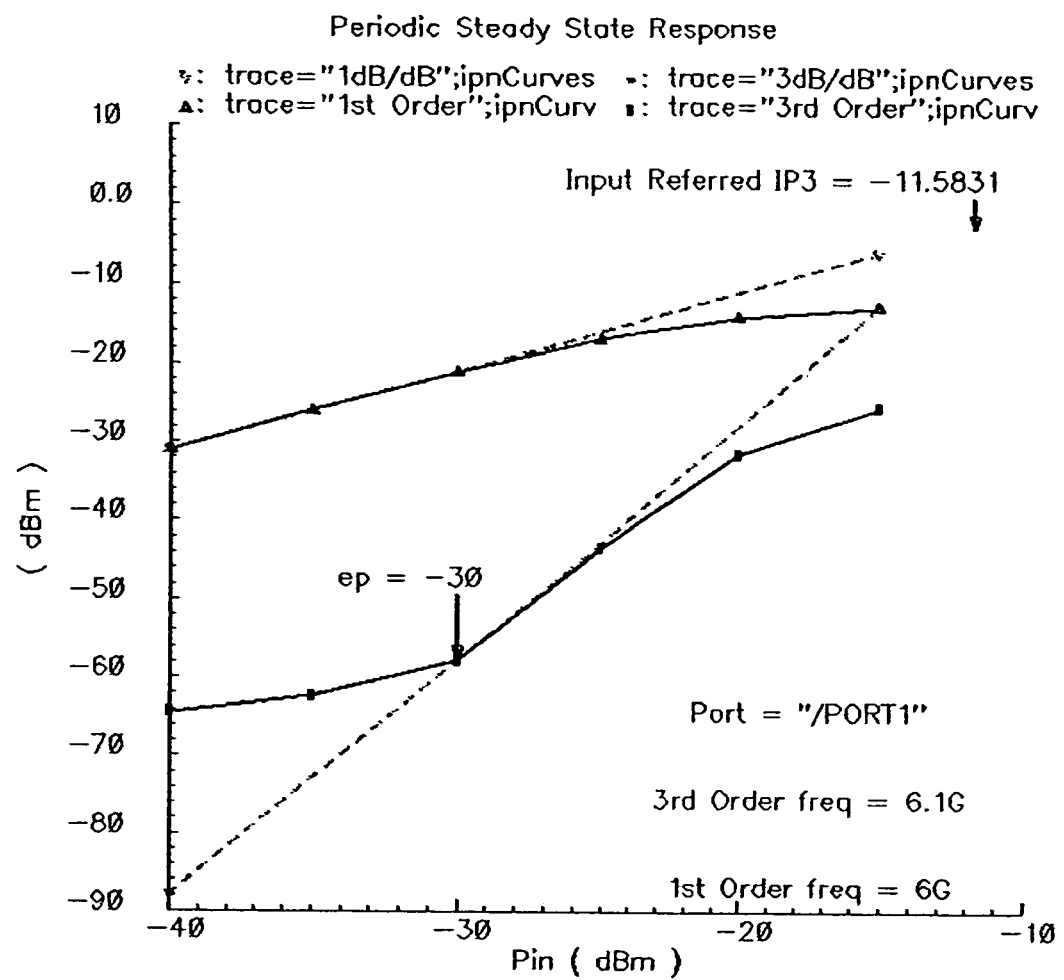
FIG. 19: illustrates a ring oscillator LNA IP3 plot@output port with 3rd order frequency=6.1 GHz.

FIG. 18 shows the IP3 point obtained from extrapolating the 3rd order output power of 5.8 GHz at −13.2 dBm after the buffer was added, while FIG. 19 shows the IP3 point obtained from extrapolating the 3rd order output power of 6.1 GHz at −11.6 dBm. The plot in FIG 18 shows that the P-1 dB point at the output is 2 dB lower because the buffer increases compression.

ESD Protection

Figure 22:
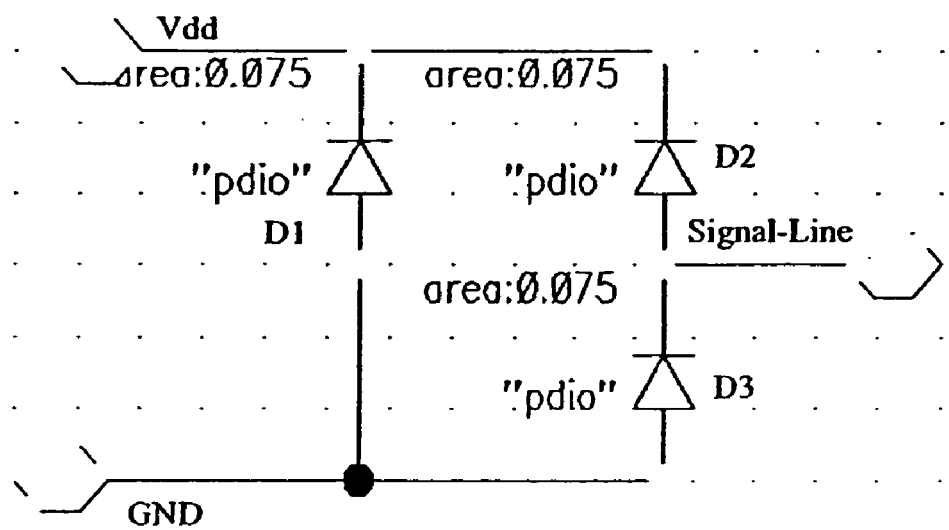
FIG. 22: illustrates a schematic of an ESD protection circuit used in accordance with an embodiment of the invention.

In one embodiment, the LNA includes ESD protection. The ESD protection circuit in accordance with the teachings of this invention was created using three diodes. The ESD protection circuit shown in FIG. 22. All the diodes were set in the reverse bias position. The ESD protection circuit works in the following way. If the voltage at the Vdd exceeds the diode breakdown voltage (Vbkd), then the current would flow to the ground through D1 instead of flowing through the circuit. If the signal line voltage exceeds Vbkd, then the current flows to ground through D3. Finally, if the signal line voltage exceeds Vdd+0.7V, then current flows to Vdd through D2 instead of affecting the gates of the transistor.

Figure 23:
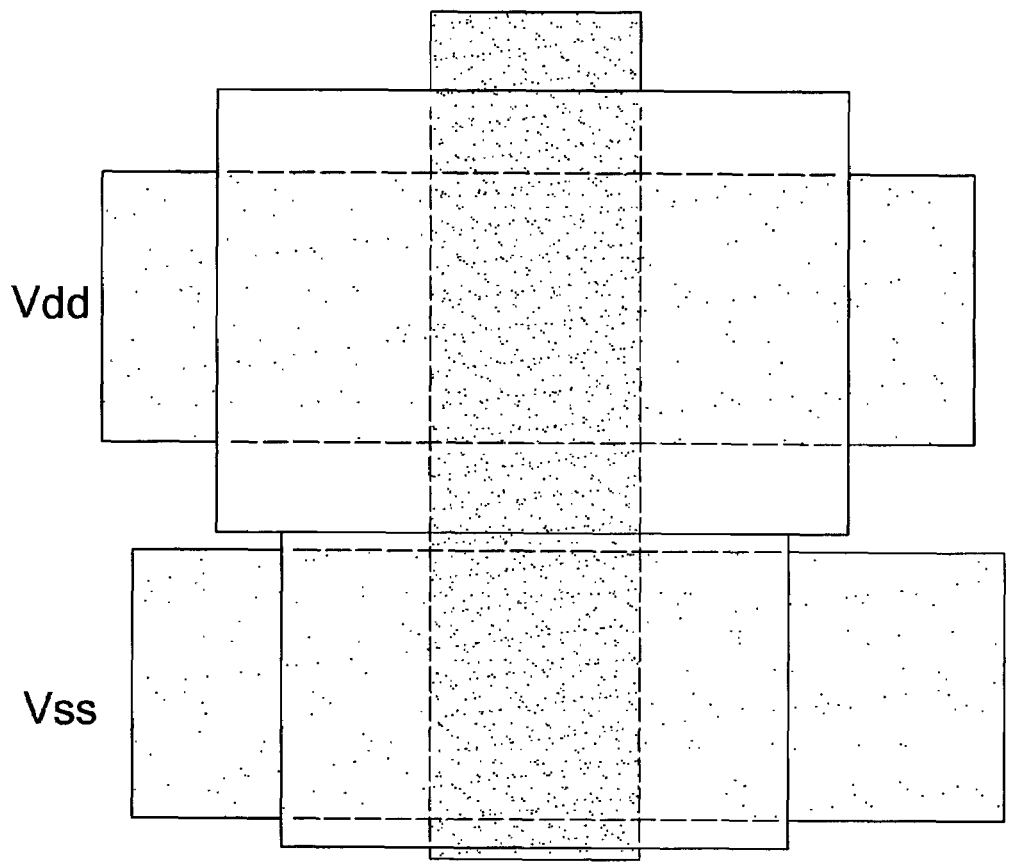
FIG. 23: illustrates the layout of the ESD circuit of FIG. 22.

FIG. 23 shows the layout of the ESD protection circuit. There were significant simulation differences before ESD protection was added and after.

LNA: PLS Results with ESD Protection

Figure 24:
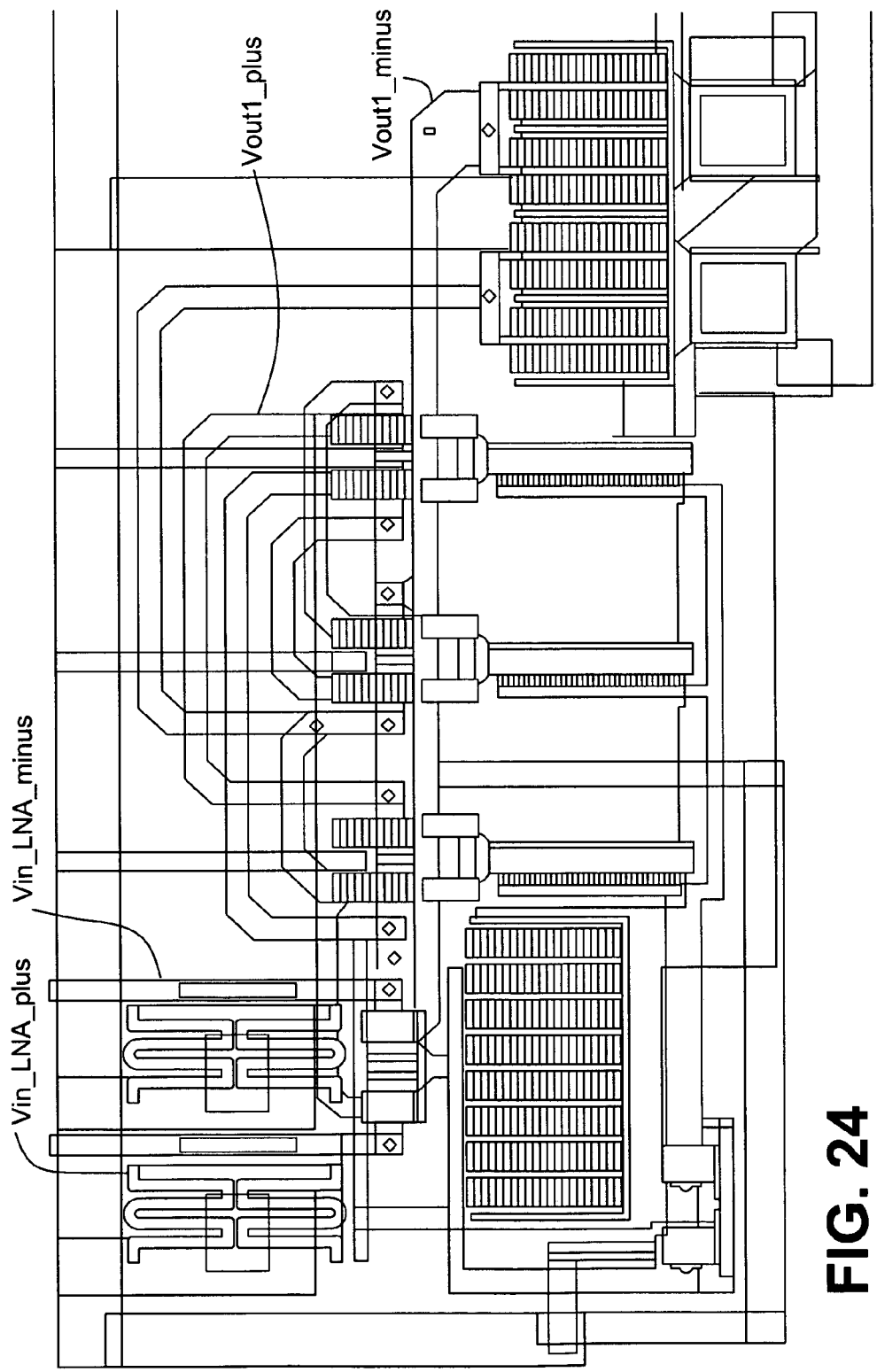
FIG. 24: illustrates an LNA layout in accordance with the teachings of this invention.
Figure 25:
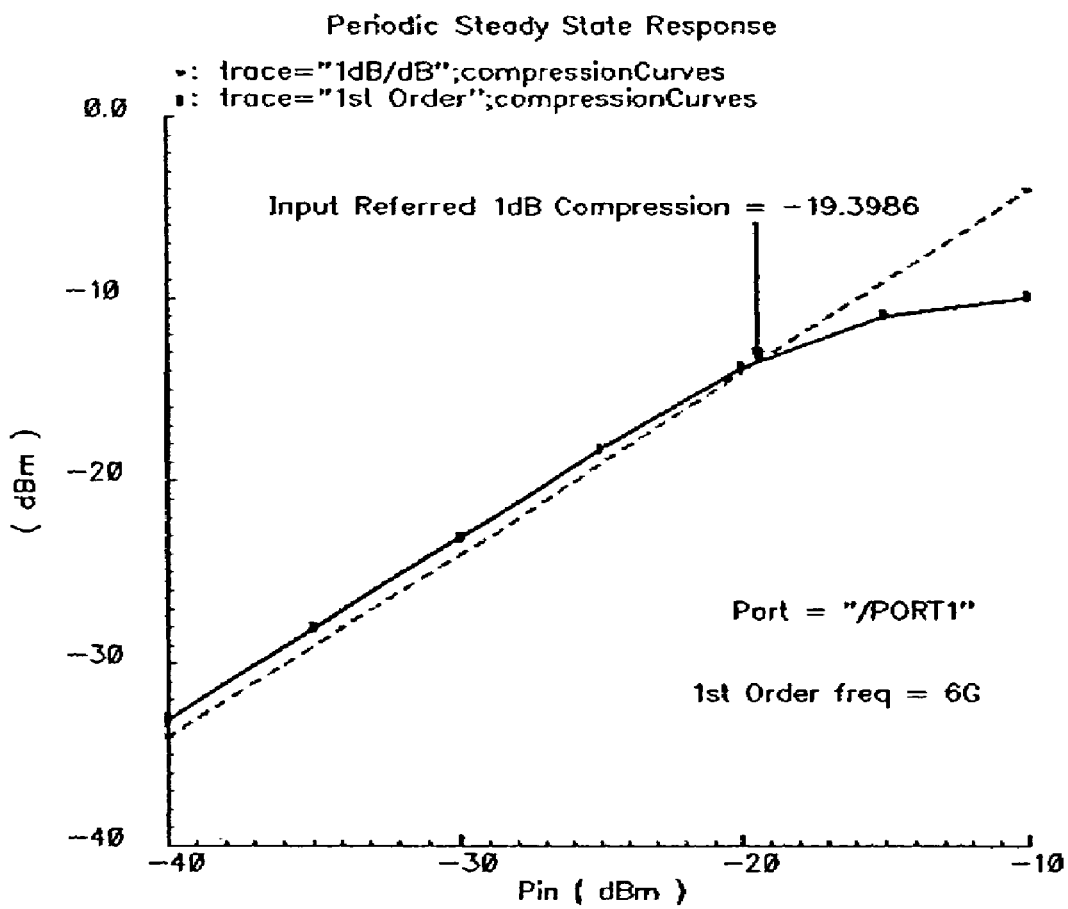
FIG. 25: illustrates an LNA PLS with ESD Protection P-1 dB plot.
Figure 26:
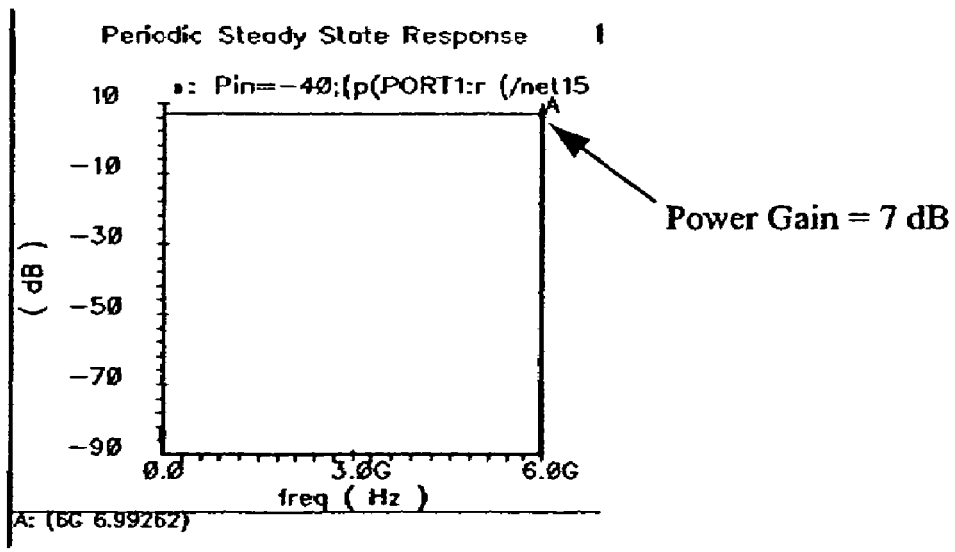
FIG. 26: illustrates an LNA PLS with ESD Protection PSS power gain@6 GHz.
Figure 27:
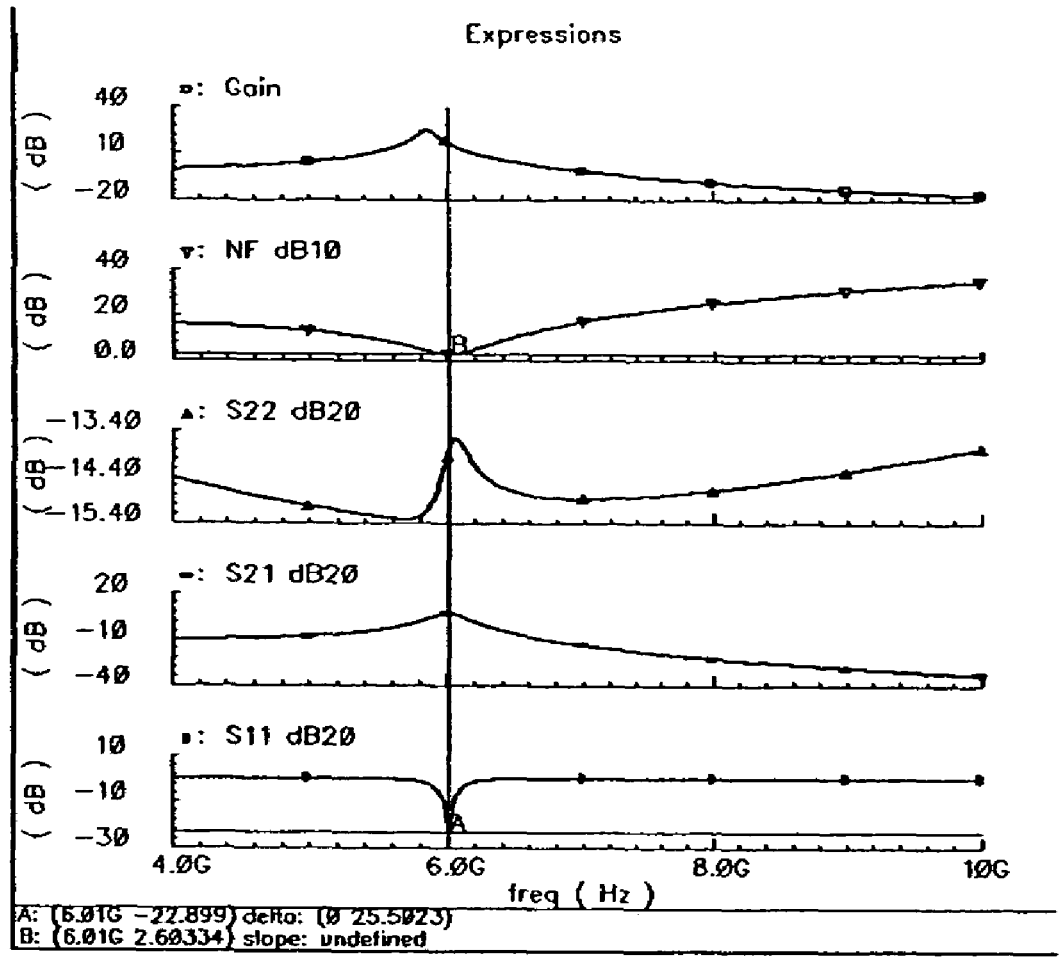
FIG. 27: illustrates an LNA PLS with ESD Protection PSS S-parameter plots.

Due to the ESD protection circuit, the NF increased to 3.3 dB, and the power gain decreased to 6.98 dB. Also the voltage gain decreased to 16 dB. The new matching component values were L1=4.365 nH and C1=1.4 pF for ZM1 (read)<50 ohms. FIG. 24 shows the LNA layout. FIG. 25 shows little difference in the 1-dB compression point of the LNA after adding the ESD protection. However FIGS. 26 and 27 show that the power gain of the LNA is now reduced to about 7 dB due to ESD protection. The power gain is 7 dB.

The original gain of the LNA, without the losses of the metal 5 paths leading up the pads was simulated to be 9 dB with a NF of 2.3 dB. After adding ESD protection diodes, the gain was reduced to 7 dB. When the losses of the transmission lines on the PCB are considered, and the losses due to the metal 5 paths leading up to the pads are taken into account, the gain of the LNA reduces to −2.5 dB. The LNA was measured and found to be working at 5.4 GHz instead of 5.98 GHz (due to process variation). This accounts for about 6 dB loss due to the fact that the signal going into and out of the LNA is no longer differential (since the Rectangular baluns on the PCB were designed to work between 5.8 and 6 GHz). Due to the process variation that could not be foreseen, which made the LNA work at 5.4 GHz instead of 5.98 Ghz, and the radiation losses that were have not been simulated and could not be measured, and because of the metal line resistances that could not be extracted in Cadence, the LAN loss can be accounted for. Thus it can be concluded that the LNA incorporating an artificial tank circuit works in principle. The measured performance is given in Table 2.

TABLE 2

LNA MEASUREMENTS

| Measurement | Simulated Value | Measured Value |
| --- | --- | --- |
| Center Frequency | 5.98 GHz | 5.435 GHz |
| Bandwidth | 200 MHz | 350 MHz |
| Gain with PCB losses | −2.5 dB | −9 dB |
| Current Consumption | 9.0 mA | 9.5 mA |
| Voltage supply | 1.8 V | 1.8 V |
| S11 | −15 dB | −22 dB |
| S22 | −20 dB | −25 dB |
| Noise Figure (Simulated) | 7.9 dB | |

It should be noted that if a gain of about −2.5 dB was measured from the PCB when connected to the Network Analyzer, then this would imply that the LNA on the die worked almost exactly as simulated. However, the measured gain was −9 dB, which means that the gain of the LNA on the die was 9 dB −(−2.5 dB)+(−9 dB)=2.5 dB, ignoring any radiation losses from the rectangular baluns. Therefore it can be concluded that the LNA on the die did work as an amplifier with a low gain.

While the teachings of this invention focus on an artificial tank used in an LNA, the artificial tank may be used in any tuned circuit, such as a mixer, which is used to up or down convert the message signal from a mixture of the carrier and the message signal. The Mixer in an RFIC receiver is a non-linear circuit used to down-convert the high frequency modulated carrier signal to a lower frequency modulated signal. The carrier signal is usually a few orders of magnitude greater than the intermediate frequency (IF) signal. Before the signal is demodulated, it has to be first converted to its original message frequency, usually in the range of hundreds of MHz. This down-conversion usually results in a high NF because the LO signal, which is used to frequency shift the modulated carrier, is generated and supplied to the Gilbert cell mixer at the gates of the upper-quad transistors without a matching network that would ensure maximum power transfer. A matching network is not desirable for the LO signal because a switching behavior is required from the LO signal to provide the "mixing" effect. Hence the upper-quad is a source of high noise in the Mixer, which is down-converted to the IF signal and added to the modulated signal. The basic building blocks of a Mixer are described in the many RFIC design books.

Numerous modifications may be made without departing from the spirit and scope of the invention as defined in the appended claims.

What is claimed is:

1. An on-chip-tuned circuit including a tank circuit serving as a load impedance for a low noise amplifier designed to operate at a predetermined radio frequency, said tank circuit being constituted by a linearized damped ring oscillator circuit with a resonant frequency corresponding to said predetermined radio frequency.

2. The tuned circuit of claim 1, further comprising at least one resistive element configured to linearize the tank circuit.

3. The tuned circuit of claim 2, wherein said ring oscillator circuit includes field effect transistors, and said resistive elements comprise source resistors for said field effect transistors.

4. The tuned circuit of claim 1, further comprising a field effect transistor having a drain coupled to the ring oscillator to stabilize the ring oscillator.

5. A tuned circuit including a tank circuit serving as a load impedance for a low noise amplifier designed to operate at a predetermined radio frequency, said tank circuit being constituted by a damped ring oscillator circuit with a resonant frequency corresponding to said predetermined radio frequency, and wherein the tuned circuit is integrated in CMOS technology and configured for a frequency of up to 7 GHz.

6. The tuned circuit of claim 1, wherein the tank circuit is in the form of an integrated circuit having a size of not more than 200 μm by 200 μm.

7. A low-noise amplification circuit for amplifying radio frequency signals, comprising:
   a tuned amplifier having an input for receiving an input signal of predetermined frequency and an output for delivering an amplified version of the input signal; and
   an artificial tank circuit providing a load impedance for said tuned amplifier, said artificial tank circuit comprising a damped ring oscillator circuit with a resonant frequency corresponding to said predetermined frequency.

8. The low-noise amplification circuit of claim 7, comprising at least one resistive element configured to linearize the ring oscillator circuit.

9. The low-noise amplification circuit of claim 8, wherein said ring oscillator circuit includes field effect transistors, and said resistive elements comprise source resistors for said field effect transistors.

10. The low-noise amplification circuit of claim 7, further comprising a field effect transistor having a drain coupled to the ring oscillator to stabilize the ring oscillator.

11. The low-noise amplification circuit of claim 7, wherein the tank circuit is integrated in CMOS technology and configured for a frequency of up to 7 GHz.

12. The low-noise amplification circuit of claim 7, wherein the tank circuit is in the form of an integrated circuit having a size of not more than 200 μm by 200 μm.

13. The tuned circuit of claim 5, wherein said CMOS technology is 0.18 μm technology.

14. The low-noise amplification circuit of claim 11, wherein said CMOS technology is 0.18 μm technology.

15. The tuned circuit of claim 1, wherein said ring oscillator is a differential ring oscillator comprising field effect transistors and linearized by including source resistors therein.

16. The low-noise amplification circuit of claim 7, wherein said ring oscillator is a differential ring oscillator comprising field effect transistors and linearized by including source resistors therein.

17. The low-noise amplification circuit of claim 7, which is integrated onto a chip.

18. The low-noise amplification circuit of claim 17, wherein said ring oscillator circuit is linearized.

* * * * *